United States Patent
Conte et al.

(10) Patent No.: US 10,879,211 B2
(45) Date of Patent: Dec. 29, 2020

(54) METHOD OF JOINING A SURFACE-MOUNT COMPONENT TO A SUBSTRATE WITH SOLDER THAT HAS BEEN TEMPORARILY SECURED

(71) Applicant: R.S.M. Electron Power, Inc., Deer Park, NY (US)

(72) Inventors: Robert Conte, North Babylon, NY (US); Dennis Zegzula, East Patchogue, NY (US); Ching Au, Garden City, NY (US)

(73) Assignee: R.S.M. Electron Power, Inc., Deer Park, NY (US)

(*) Notice: Subject to any disclaimer, the term of this patent is extended or adjusted under 35 U.S.C. 154(b) by 488 days.

(21) Appl. No.: 15/372,486

(22) Filed: Dec. 8, 2016

(65) Prior Publication Data

US 2018/0082975 A1    Mar. 22, 2018

Related U.S. Application Data

(60) Provisional application No. 62/396,975, filed on Sep. 20, 2016, provisional application No. 62/356,787, filed on Jun. 30, 2016.

(51) Int. Cl.
*B23K 1/00* (2006.01)
*H01L 23/00* (2006.01)
(Continued)

(52) U.S. Cl.
CPC ............ *H01L 24/83* (2013.01); *B23K 1/0016* (2013.01); *B23K 1/06* (2013.01); *B23K 1/20* (2013.01);
(Continued)

(58) Field of Classification Search
CPC ........ H05K 1/0203; B23K 1/008; B23K 1/06; B23K 1/0016
See application file for complete search history.

(56) References Cited

U.S. PATENT DOCUMENTS

| | | |
|---|---|---|
| 4,709,253 A | 11/1987 | Walters |
| 4,870,225 A | 9/1989 | Anao et al. |
| | (Continued) | |

FOREIGN PATENT DOCUMENTS

| | | |
|---|---|---|
| JP | 0195589 A | 4/1989 |
| JP | 5151856 B2 | 2/2013 |
| KR | 101411937 B1 | 6/2014 |

OTHER PUBLICATIONS https://www.archelmets.com/what-is-tack-welding/; 2017 (Year: 2017).*
(Continued)

*Primary Examiner* — Erin B Saad
(74) *Attorney, Agent, or Firm* — Venable LLP

(57) ABSTRACT

A method of joining a surface-mount component to a substrate includes placing a piece of solder on top of the substrate and temporarily bonding the piece of solder to the substrate with at least one temporary bond. The method also includes placing a surface-mount component on top of the substrate with a bottom face of the surface-mount component facing the substrate. The surface-mount component has at least one lateral side. The method further includes positioning the surface-mount component with the at least one lateral side proximate the piece of solder, heating the substrate and the piece of solder to a joining temperature for a time sufficient for the solder to flow into an area between the bottom face of the surface-mount component and the substrate, and cooling the substrate and solder.

17 Claims, 19 Drawing Sheets

(51) Int. Cl.
*B23K 1/06* (2006.01)
*B23K 1/20* (2006.01)
*B23K 20/00* (2006.01)
*B23K 101/42* (2006.01)

(52) U.S. Cl.
CPC ............ *B23K 20/004* (2013.01); *H01L 24/27* (2013.01); *H01L 24/743* (2013.01); *B23K 2101/42* (2018.08); *H01L 24/29* (2013.01); *H01L 24/32* (2013.01); *H01L 2224/27436* (2013.01); *H01L 2224/2929* (2013.01); *H01L 2224/29111* (2013.01); *H01L 2224/29116* (2013.01); *H01L 2224/32225* (2013.01); *H01L 2224/83005* (2013.01); *H01L 2224/83065* (2013.01); *H01L 2224/83075* (2013.01); *H01L 2224/83101* (2013.01); *H01L 2224/83192* (2013.01); *H01L 2224/83447* (2013.01); *H01L 2224/83801* (2013.01); *H01L 2224/83815* (2013.01); *H01L 2224/83948* (2013.01)

(56) References Cited

U.S. PATENT DOCUMENTS

| | | | |
|---|---|---|---|
| 4,976,392 | A | 12/1990 | Smith et al. |
| 5,361,973 | A | 11/1994 | Ishii et al. |
| 5,894,981 | A | 4/1999 | Kelly |
| 5,992,729 | A * | 11/1999 | Koopman ................ B23K 1/06 228/175 |
| 6,386,422 | B1 * | 5/2002 | Cheng .................... B23K 1/008 228/46 |
| 6,946,745 | B2 | 9/2005 | Hesse |
| 7,186,926 | B2 | 3/2007 | Maeno |
| 7,466,030 | B2 | 12/2008 | Seko |
| 7,523,775 | B2 | 4/2009 | Matsumura |
| 8,481,370 | B2 | 7/2013 | Nishi et al. |
| 9,165,842 | B2 | 10/2015 | Gillotti |
| 2002/0031903 | A1 | 3/2002 | Yamauchi et al. |
| 2002/0090162 | A1 | 7/2002 | Asada et al. |
| 2002/0195476 | A1 | 12/2002 | Baba et al. |
| 2002/0195707 | A1 * | 12/2002 | Bernier ................... H01L 24/10 257/738 |
| 2003/0111262 | A1 | 6/2003 | Kikuchi et al. |
| 2004/0194992 | A1 | 10/2004 | Pai |
| 2004/0212054 | A1 | 10/2004 | Maxwell et al. |
| 2004/0212083 | A1 | 10/2004 | Yang |
| 2004/0238948 | A1 | 12/2004 | Shiozawa et al. |
| 2005/0029666 | A1 | 2/2005 | Kurihara et al. |
| 2005/0093115 | A1 | 5/2005 | Eytcheson |
| 2005/0252681 | A1 | 11/2005 | Runyon et al. |
| 2006/0221501 | A1 | 10/2006 | Sato et al. |
| 2007/0057373 | A1 | 3/2007 | Okumura et al. |
| 2008/0173700 | A1 | 7/2008 | Matthews |
| 2008/0303145 | A1 | 12/2008 | Takizawa et al. |
| 2009/0102054 | A1 | 4/2009 | Theuss et al. |
| 2009/0134529 | A1 | 5/2009 | Ishii et al. |
| 2009/0152327 | A1 * | 6/2009 | Matsumura .......... B23K 20/005 228/110.1 |
| 2009/0315172 | A1 | 12/2009 | Lim et al. |
| 2010/0101845 | A1 | 4/2010 | Kishi et al. |
| 2010/0123231 | A1 | 5/2010 | Takahashi |
| 2011/0036628 | A1 | 2/2011 | Aihara |
| 2011/0037153 | A1 | 2/2011 | Zhu et al. |
| 2011/0050051 | A1 | 3/2011 | Kondo et al. |
| 2011/0147916 | A1 | 6/2011 | Su |
| 2011/0204457 | A1 | 8/2011 | Ono et al. |
| 2012/0111617 | A1 | 5/2012 | Motomura et al. |
| 2012/0241934 | A1 | 9/2012 | Miyake |
| 2012/0241949 | A1 | 9/2012 | Sasaki et al. |
| 2012/0306087 | A1 | 12/2012 | Bayerer et al. |
| 2013/0043015 | A1 | 2/2013 | Straznicky et al. |
| 2013/0264714 | A1 | 10/2013 | Gong et al. |
| 2014/0048949 | A1 | 2/2014 | Lin et al. |
| 2014/0191250 | A1 | 7/2014 | Tanimoto et al. |
| 2014/0224862 | A1 | 8/2014 | Matsushita et al. |
| 2015/0216054 | A1 | 7/2015 | Standing |
| 2015/0255378 | A1 | 9/2015 | Taguchi |
| 2015/0289371 | A1 | 10/2015 | Ozaki et al. |
| 2015/0294791 | A1 | 10/2015 | Hwang et al. |
| 2015/0303236 | A1 | 10/2015 | Sakota |
| 2016/0325370 | A1 * | 11/2016 | Prociw ................... B23K 35/32 |

OTHER PUBLICATIONS

Kay, "Braze Fixturing via Tack-welding—the Good and the Bad" https://vacaero.com/information-resources/vacuum-brazing-with-dan-kay/1428-braze-fixturing-via-tack-welding-the-good-and-the-bad.html, Feb. 9, 2015 (Year: 2015).*

Thomaz, T.P., et al. "A Novel Method of Fabricating 3D Microelectronic Circuits Using Metal Wet Deposition over Oxidized Silicon"; available at http://www.lbd.dcc.ufmg.br/colecoes/sforum/2011/003.pdf.

Kim et al., "Ultrasonic Bonding for MEMS Sealing and Packaging", IEEE Transactions on Advanced Packaging, vol. 32, No. 2, May 2009, pp. 461-467.

Zhong et al., "Recent Advances in Wire Bonding, Flip Chip and Lead-free Solder for Advanced Microelectronics Packaging", Microelectronics International 24.3 (2007), pp. 18-26.

* cited by examiner

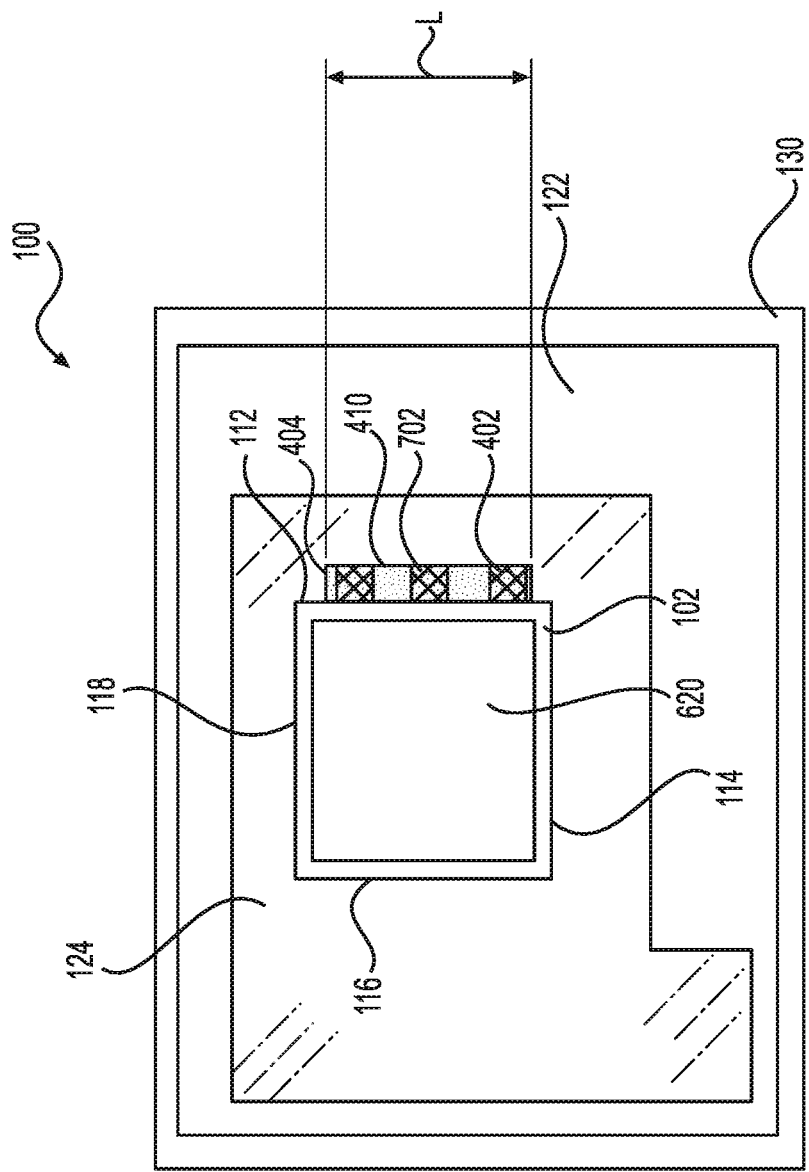

METHOD OF JOINING A SURFACE-MOUNT COMPONENT TO A SUBSTRATE WITH SOLDER THAT HAS BEEN TEMPORARILY SECURED

CROSS-REFERENCE TO RELATED APPLICATIONS

This application claims the benefit under 35 U.S.C. § 119(e) of U.S. Provisional Patent Application No. 62/356,787, filed Jun. 30, 2016, and titled "Method of Joining a Die to a Substrate with Solder that Has Been Temporarily Secured." This application also claims the benefit under 35 U.S.C. § 119(e) of U.S. Provisional Patent Application No. 62/396,975, filed Sep. 20, 2016, and titled "Method of Joining a Surface-Mount Component to a Substrate with Solder that Has Been Temporarily Secured." The foregoing applications are hereby incorporated by reference in their entirety and are made a part of this specification for all that they disclose.

FIELD OF THE INVENTION

This invention relates to a method of manufacturing a package for a surface-mount device and, in particular, a method of joining a surface-mount component to a substrate with a solder that has been temporarily secured.

BACKGROUND OF THE INVENTION

Surface-mounted semiconductors are used in a wide variety of applications including, for example, power modules. In such applications, a die is attached to a substrate by soldering. Conventional soldering methods can include using vacuum/pressure soldering systems or a solder preform. A solder preform is pre-cut to the size of the die, placed under the die, and reflowed in a controlled environment. Conductive epoxies and silver sintering can also be used to attach the die.

These processes, however, may introduce voids between the die and the substrate. The voids increase the thermal resistance of the solder interface resulting in higher die temperatures during operation. There is thus a need for a method of joining a die to a substrate that minimizes or completely eliminates solder voids and, in particular, a method that does so with high throughput, good quality, and consistency.

SUMMARY OF THE INVENTION

In one aspect, the invention relates to a method of joining a surface-mount component to a substrate. The method includes placing a piece of solder on top of the substrate and temporarily bonding the piece of solder to the substrate. The method also includes placing a surface-mount component on top of the substrate with a bottom face of the surface-mount component facing the substrate. The surface-mount component has a lateral side. The method further includes positioning the surface-mount component with the lateral side proximate the piece of solder. The method further includes heating the substrate and the piece of solder to a joining temperature for a time sufficient for the solder to flow into an area between the bottom face of the surface-mount component and the substrate, and cooling the substrate and solder.

In another aspect, the invention relates to a method of joining a surface-mount component to a substrate. The method includes providing a substrate with a surface-mount component on a top surface thereof and a piece of solder temporally bonded to the substrate. The surface-mount component has a lateral side and the piece of solder is placed proximate the lateral side. The method also includes placing a piece of solder proximate the lateral side of the surface-mount component and temporarily bonding the piece of solder to the substrate. The method further includes heating the substrate and the piece of solder to a joining temperature for a time sufficient for the solder to flow into an area between the bottom face of the surface-mount component and the substrate, and cooling the substrate and solder.

In a further aspect, the invention relates to a method of forming a plurality of surface-mount devices. The method includes placing a first piece of solder on top of a first substrate and temporarily bonding the first piece of solder to the first substrate. The method also includes placing a second piece of solder on top of a second substrate and temporarily bonding the second piece of solder to the second substrate. The method further includes assembling a first arranged surface-mount assembly and assembling a second arranged surface-mount assembly. Assembling the first arranged surface-mount assembly includes placing a first surface-mount component on top of the first substrate with a bottom face of the first surface-mount component facing the first substrate. The first surface-mount component has a lateral side. Assembling the first arranged surface-mount assembly also includes positioning the first surface-mount component with the lateral side of the first surface-mount component proximate the first piece of solder. Assembling the second arranged surface-mount assembly includes placing a second surface-mount component on top of a second substrate with a bottom face of the second surface-mount component facing the second substrate. The second surface-mount component has a lateral side. Assembling the second arranged surface-mount assembly also includes positioning the second surface-mount component with the lateral side of the second surface-mount component proximate the second piece of solder. The method of forming a plurality of surface-mount devices further includes heating the first and second arranged surface-mount assemblies to a joining temperature, holding the first and second arranged surface-mount assemblies at a temperature greater than or equal to the joining temperature for a time sufficient for the solder to flow into areas between the bottom face of the first and second surface-mount components and the first and second substrates, and cooling the first and second arranged surface-mount assemblies to form a plurality of surface-mount devices.

These and other aspects of the invention will become apparent from the following disclosure.

BRIEF DESCRIPTION OF THE DRAWINGS

FIG. 5A is a side view of the semiconductor package at a first point in time in step S310. FIG. 5B is a side view of the semiconductor package at a second point in time in step S310. FIG. 5C is a side view of the semiconductor package at a third point in time in step S310. FIG. 5D is a side view of the semiconductor package at a fourth point in time in step S310. FIG. 5E is a side view of the semiconductor package at a fifth point in time in step S310.

FIG. 7 is a top view of the semiconductor package 100 after step S310 with an intermediate temporary bond.

DETAILED DESCRIPTION OF THE PREFERRED EMBODIMENTS

Figure 1:
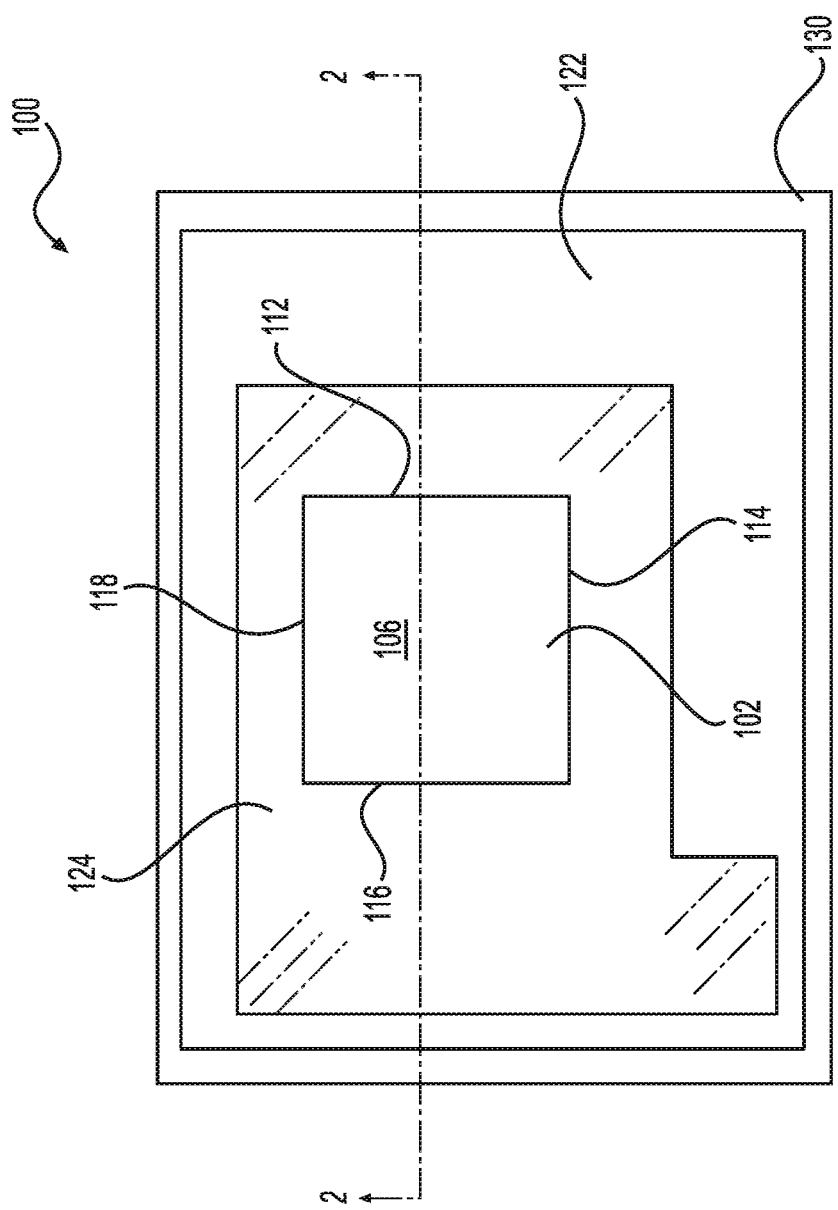
FIG. 1 shows a top view of a semiconductor package.

Exemplary preferred embodiments of the invention will now be described with reference to the accompanying figures. The same reference numerals used between different figures refer to the same or similar elements throughout the figures and description.

Figure 2:
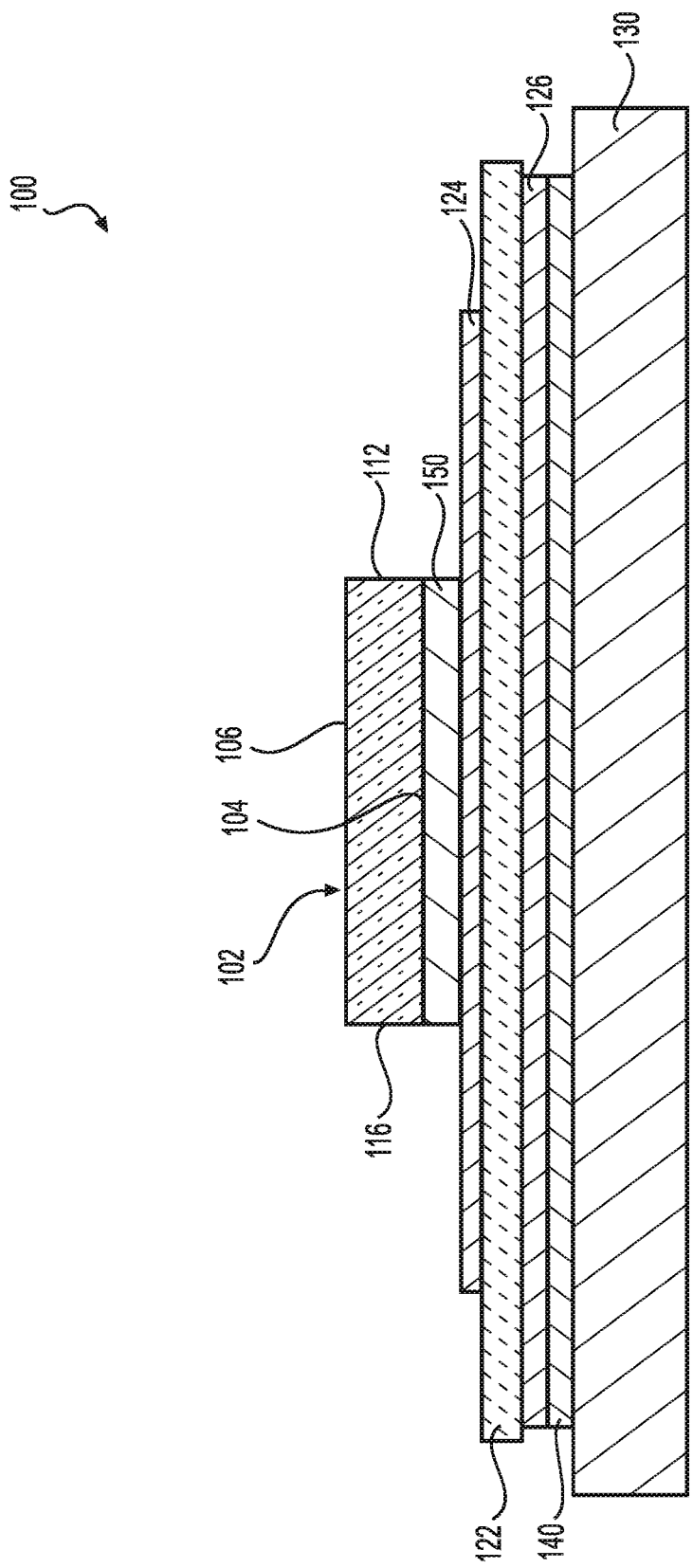
FIG. 2 is a cross-section view of a portion of the semiconductor package in FIG. 1 taken along line 2-2.

FIG. 1 shows a top view of a surface-mount device that may be manufactured using methods described herein. FIG. 2 is a cross-section view of a portion of the surface-mount device in FIG. 1 taken along line 2-2. In the exemplary preferred embodiments of the invention described herein the surface-mount device is a semiconductor package 100 that includes a semiconductor (also referred to as a die) 102 joined to a substrate 122. The method described herein may be applicable to join any suitable surface-mount component to the substrate 122 and create any suitable surface mount device. Suitable surface-mount components include, for example, the die 102 (as described in the exemplary preferred embodiments herein), a heat spreader, a bonds pad, an integrated circuit, a regulator, a passive component (such as a resistor), or a pin and substrate attach. In this embodiment, the substrate is also joined to a baseplate 130, but the surface-mounted semiconductor package may be constructed without the baseplate 130 as well.

Any suitable die may be used, and while the die described in the embodiments below has a cuboid geometry, dies having other shapes could, of course, be used, such as cylinder, a triangular prism, and a hexagonal prism, for example. The die 102 has a bottom face 104 and a top face 106. The die 102 also has four lateral sides: a first lateral side 112, a second lateral side 114, a third lateral side 116, and a fourth lateral side 118.

In this example, the substrate 122 is an electrically insulating substrate, which may be made from any suitable material known in the art including ceramic, glass, and composite material. Suitable ceramic materials may include, for example, alumina, aluminum nitride, silicon nitride, and beryllium oxide. Other suitable materials may include glass-reinforced epoxy such as FR4 and insulated metal substrates (IMS). Other non-insulating substrates may also be used. The substrate 122 is also preferably a metallized substrate having a top metallization layer 124 and a bottom metallization layer 126. The top and bottom metallization layers 124, 126 may be formed on a top and bottom surface, respectively, of the substrate 122 by any suitable method known in the art such as direct bonding, plated up technique, active metal brazing, and the like. Although any suitable material may be used, the top and bottom metallization layers 124, 126 may preferably comprise copper. The thickness of each of top and bottom metallization layers 124, 126 is preferably from about 0.5 mil to about 12 mils.

In this embodiment, the bottom metallization layer 126 is used to join the substrate 122 with the baseplate 130, but the use of a baseplate is not required. The bottom metallization layer 126 is joined with the baseplate 130 using baseplate attachment layer 140. The baseplate attachment layer may be any suitable material known in the art including, for example, solder, and thermally conductive epoxy. The baseplate may be used to provide structural support to the semiconductor package 100 and used to attach the semiconductor package 100 to the device that the semiconductor package 100 is being used in.

The top metallization layer 124 is used to join the substrate 122 with the die 102. The substrate 122 is joined with the die 102 by an attachment layer 150. The attachment layer 150 comprises solder, and the die 102 is joined using the methods described below. Although the exemplary preferred embodiments of the invention described herein use an attachment layer 150 comprising solder, a polymeric material may be used to form the attachment layer 150 instead. Like using solder wire initially attached to the substrate with a temporary bond (described further below), the polymeric material may be in wire form and temporally bonded to the substrate 122 with a temporary bond, which is preferably a thermal bond. While the following embodiments refer to a metallized substrate 122 and, in particular, a top metallization layer 124, the invention is not so limited and other substrates, as discussed above, may be used.

I. First Embodiment

The method of joining the die 102 to the substrate 122 and a system for joining the die 102 to the substrate according to a first preferred embodiment will now be described with reference to the flow chart shown in FIG. 3. FIG. 4 shows a top view of the semiconductor package 100 after step S310.

In step S302 a piece of solder 410 is placed on top of the metallized substrate 122, specifically on top of top metallization layer 124. In this embodiment, the piece of solder 410 has a cylindrical geometry, and may be manufactured by cutting solder wire to length. The diameter of the solder wire may vary depending upon the area being covered or the desired thickness of the attachment layer 150. Preferably, the diameter of the solder is from 0.005 inches to 0.025 inches. The piece of solder 410 may comprise any suitable solder material known in the art. Preferably the piece of solder 410 has a melting point between about 160° C. and about 380° C., such solders include: a tin/lead alloy comprising 63 weight-percent tin and 37 weight-percent lead; a tin alloy comprising 96.5 weight-percent tin, 3.0 weight-percent silver, and 0.5 weight-percent copper; and a lead/tin alloy comprising 92.5 weight-percent lead, 5.0 weight-percent tin, and 2.5 weight-percent silver.

In step S304, the solder 410 is temporarily secured to the top metallization layer 124 of the substrate 122. Temporarily securing the solder 410 to the substrate 122 prevents the solder 410 from moving out of position during subsequent processing steps and enables the substrate 122 and solder 410 to be positioned and stored to create an inventory for batch processing, instead of moving directly to subsequent processing steps.

The piece of solder 410 may be temporarily secured by making at least one temporary bond 402, 404. The temporary bond is suitably strong enough to hold the piece of solder 410 in place against forces that can cause it to move. The temporary bond is preferably able to resist a pull or shear forces of at least 100 grams. The bond is temporary in that, during subsequent thermal processing, the bonded portions of the solder 410 flow with the rest of the solder 410. A preferred temporary bond is made using ultrasonic waves, but any suitable temporary bond may be used including temporary bonds made by laser welding, for example. The solder 410 may be temporarily secured by making at least one ultrasonic bond between the solder 410 and the top metallization layer 124. Ultrasonic bonds are advantageous for several reasons. For example, the ultrasonic bonds can be made at room temperature, avoiding any significant changes to the underlying metallography of the die 102, piece of solder 410, and top metallization layer 124 that would alter their mechanical, electrical, and thermal performance. Ultrasonic bonds can be made without solder oxide formation even under normal atmospheric conditions, avoiding complex atmospheric controls. Ultrasonic bonding may also be used on a variety of geometries and thicknesses without concerns of degrading its performance.

Certain solder 410 and top metallization layer 124 combinations may be more compatible with the use of an ultrasonic bond as the temporary bond. A preferred suitable combination which is compatible with the ultrasonic bonding process described herein includes a solder comprised of 92.5 weight-percent lead, 5.0 weight-percent tin, and 2.5 weight-percent silver bonded to gold plating.

Another advantage of ultrasonic bonding is that placing the piece of solder 410 (step S302) and securing the solder (step S304) may be performed with the same ultrasonic bonder, thus combining steps S302 and S304 as step S310. Any suitable ultrasonic bonder may be used, but an advantageous ultrasonic bonder that positions the piece of solder 410, as well as bonds, is 3600 PLUS made by Kulicke & Soffa of Singapore. FIGS. 5A through 5E show how the piece of solder 410 is placed and secured in step S310.

Figure 5A:
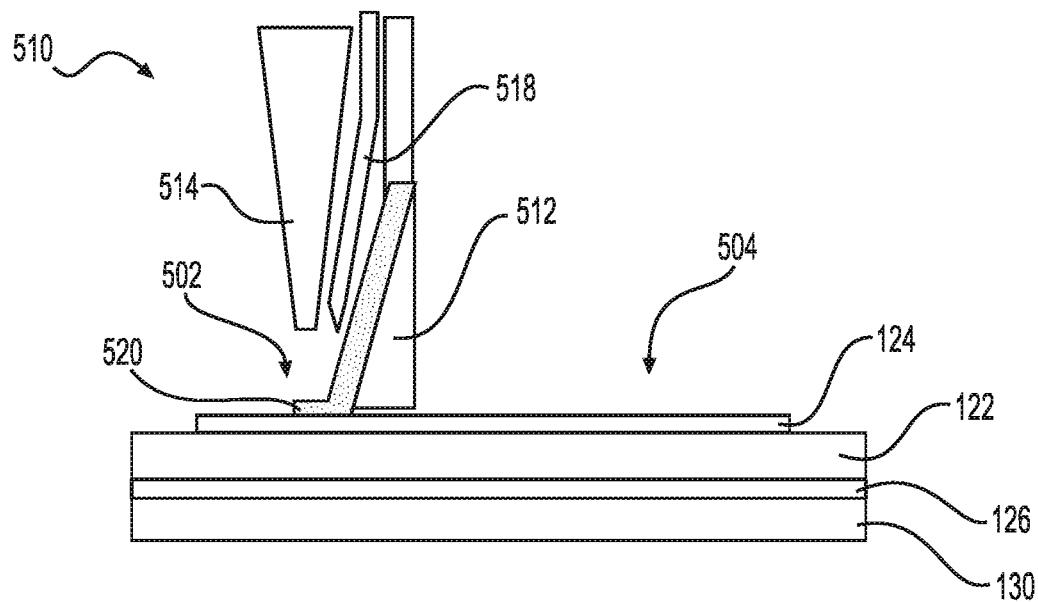
FIGS. 5A through 5E show how a piece of solder is placed and secured in step S310.

As shown in FIG. 5A, the ultrasonic bonder of this embodiment includes a head 510 that, in step S310, is positioned at a first bonding position 502. The solder wire 520, which will become the piece of solder 410 once placed and secured, is fed along a guide path 512 from a spool (not shown).

Figure 4:
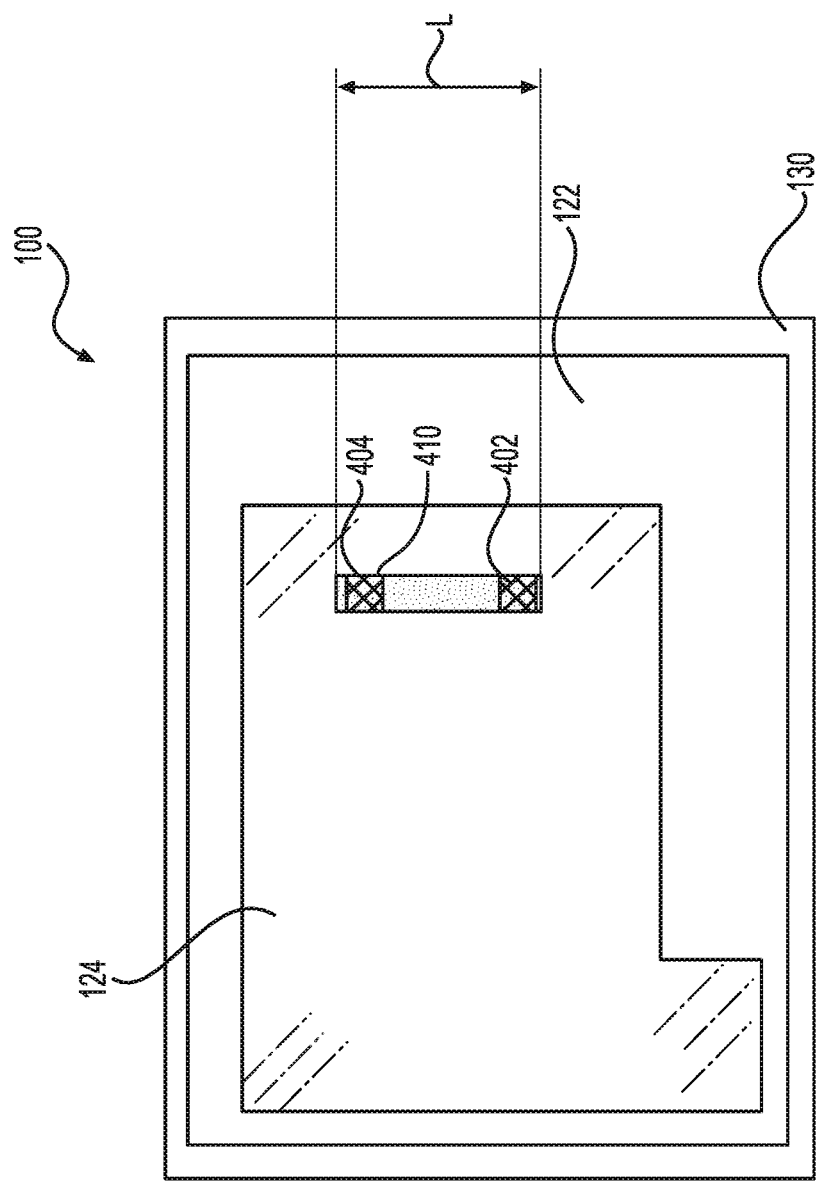
FIG. 4 is a top view of the semiconductor package after step S310.
Figure 5B:
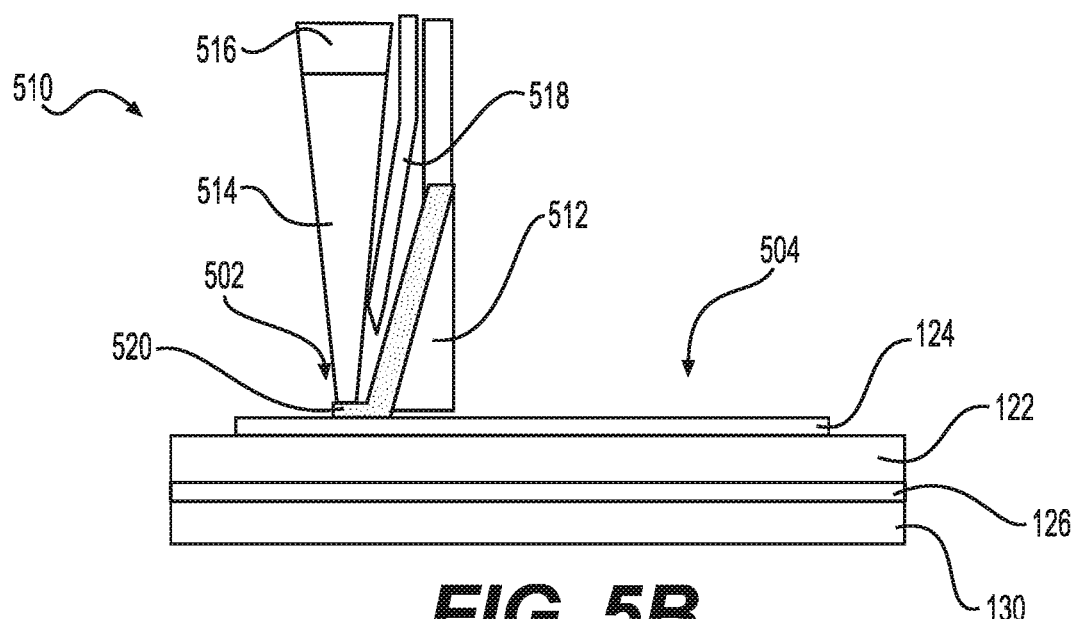

As shown in FIG. 5B, a bonding tool 514 is lowered to contact the solder wire 520 and ensure contact between the solder wire 520 and the top metallization layer 124. The bonding tool 514 may be, for example, a metal rod that transmits ultrasonic energy down its length to an inverted V-shaped tip that contacts two quadrants of the round solder wire 520. The bonding tool applies a predetermined force to the solder wire. Preferably the predetermined force is from 1 N to 12 N, and more preferably from 4 N to 10 N. The bonding tool 514 is connected to a piezoelectric transducer 516 that generates ultrasonic vibrations in the bonding tool 514 when energized. With the bonding tool 514 in contact with the solder wire 520, the piezoelectric transducer 516 is energized to ultrasonically bond a portion of the solder wire 520 to the top metallization layer 124 (first temporary bond 402 in FIG. 4). Preferably, the ultrasonic waves are compressive waves. The ultrasonic waves are preferably generated with a frequency from 40 kHz. to 90 kHz. and more preferably from 55 kHz. to 65 kHz. The ultrasonic waves are preferably applied for a duration between 50 milliseconds (msec.) and 300 msec. (inclusive), and more preferably between 100 msec. and 200 msec. (inclusive).

Figure 5C:
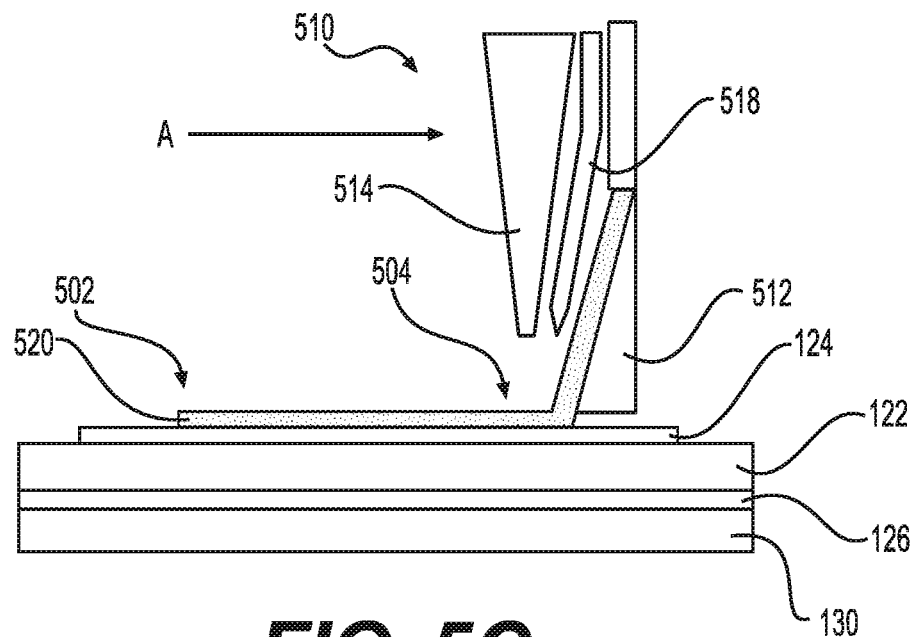

After the solder wire 520 is bonded at the first bonding position 502, the bonding tool 514 is retracted and the head 510 moved, as solder wire 520 is played out from the spool, to a second bonding position 504, as shown in FIG. 5C. The head 510 is moved laterally in the direction indicated by arrow A and any significant vertical (direction perpendicular to arrow A) movement of the head 510 is preferably avoided to ensure the solder wire 520 lies flat and in contact with the top metallization layer 124. Keeping the solder wire 520 in contact with the top metallization layer will assist with the subsequent thermal processing of the semiconductor package 100, and the solder wire 520 is preferentially substantially in contact with the top metallization layer between the first and second bonding positions.

Figure 5D:
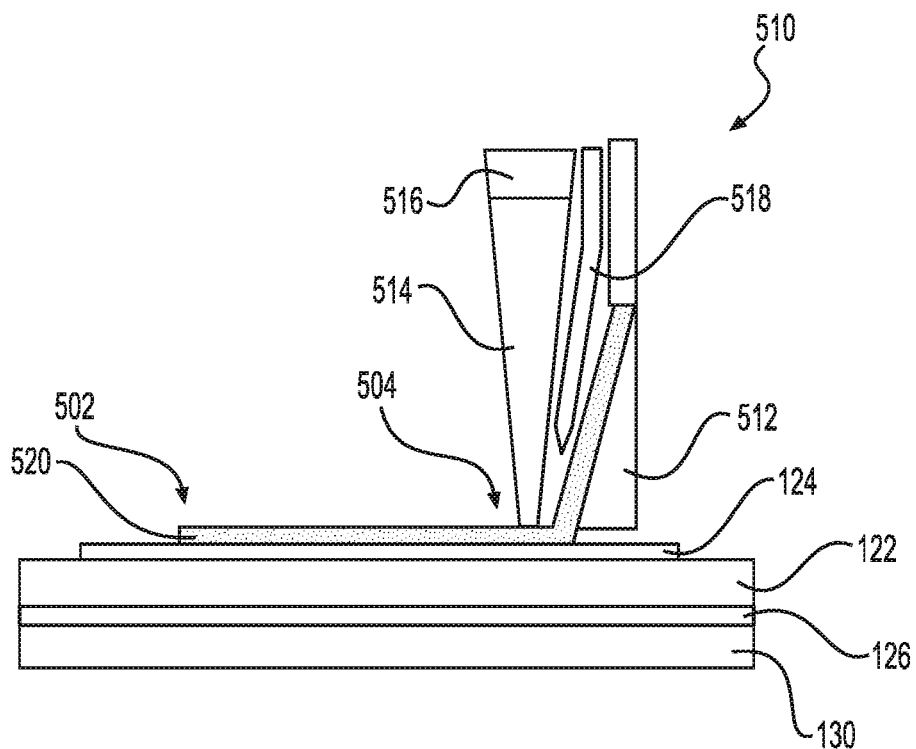
Figure 5E:
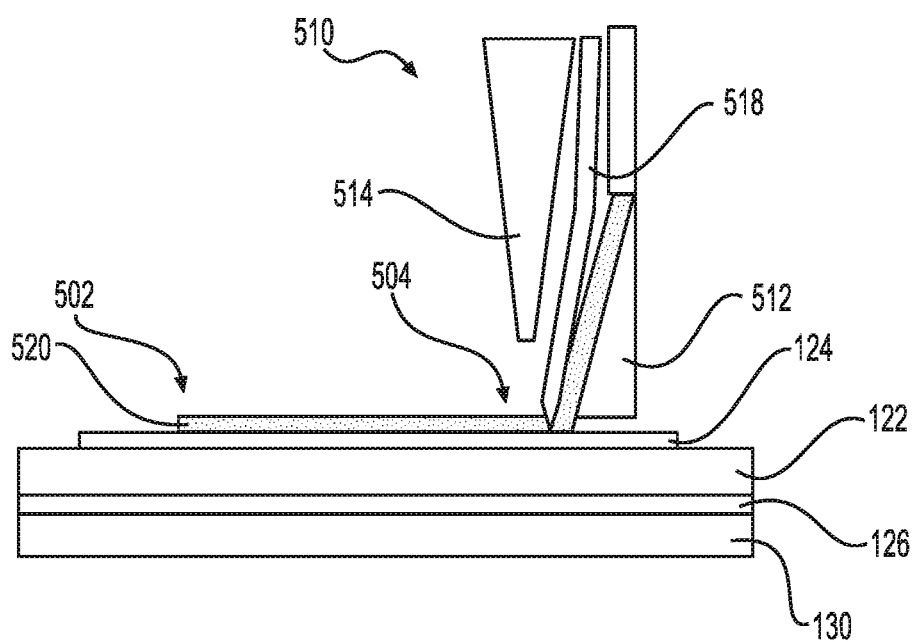

As shown in FIG. 5D, the ultrasonic bonding process is repeated, where the bonding tool 514 is brought into contact with the solder wire 520 and ultrasonic waves are used to bond the solder wire 520 to the top metallization layer 124 at the second bonding position 504 to create a second temporary bond 404 (see FIG. 4). Once the ultrasonic bonding process is completed, the bonding tool 514 is again retracted and a cutter 518 is extended to cut the solder wire 520, as shown in FIG. 5E. The head 510 can then be retracted leaving a piece of solder 410 that has been secured to the substrate 122 at two ends (first and second temporary bonds 402, 404).

Figure 3:
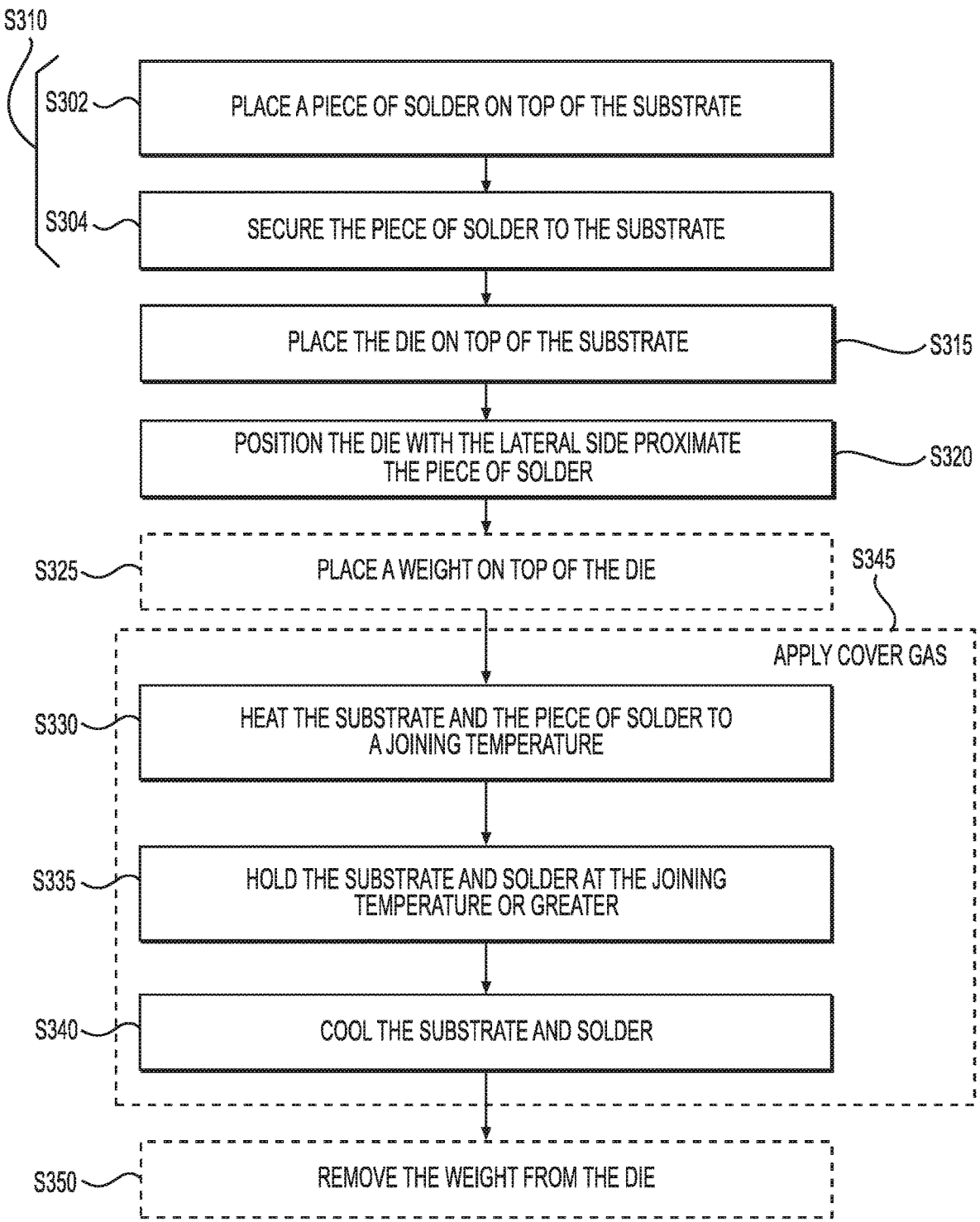
FIG. 3 is a flowchart of a method of joining a die to a substrate according to a first preferred embodiment of the invention.
Figure 6A:
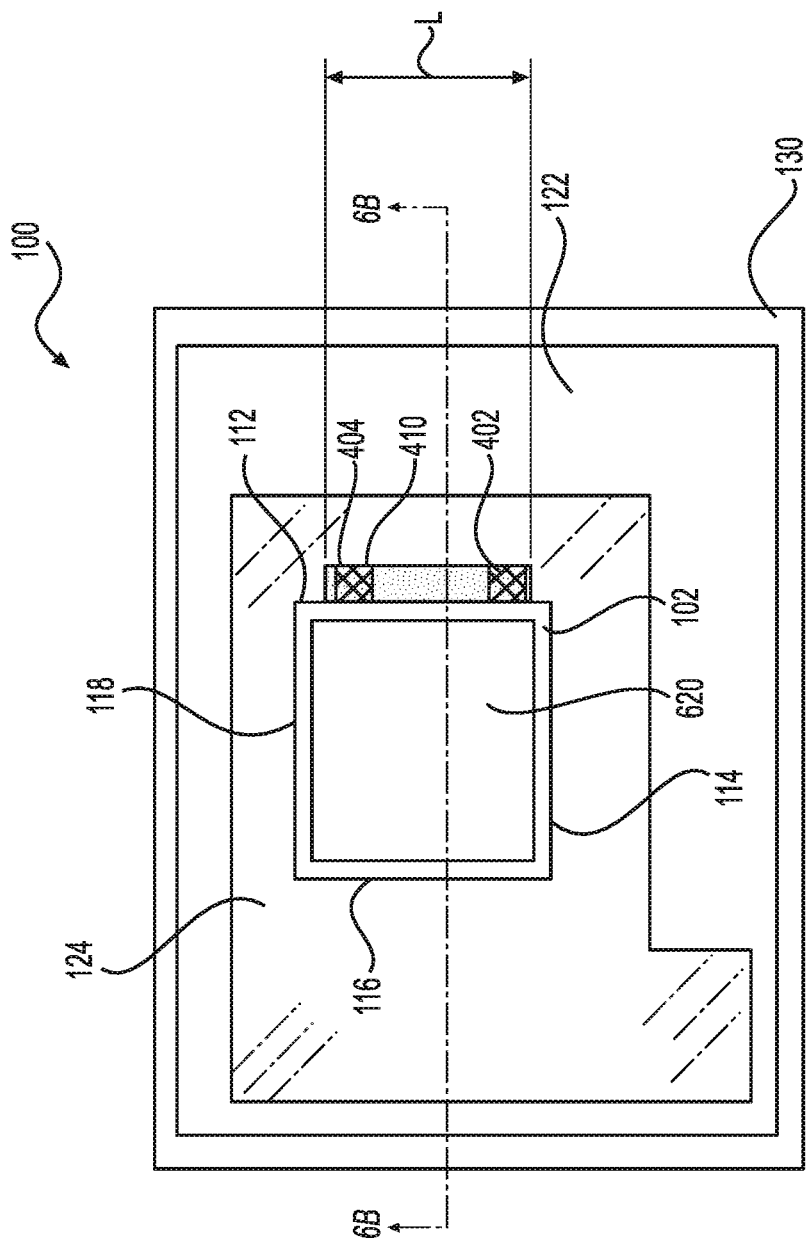
FIG. 6A is a top view of the semiconductor package at step S325.
Figure 6B:
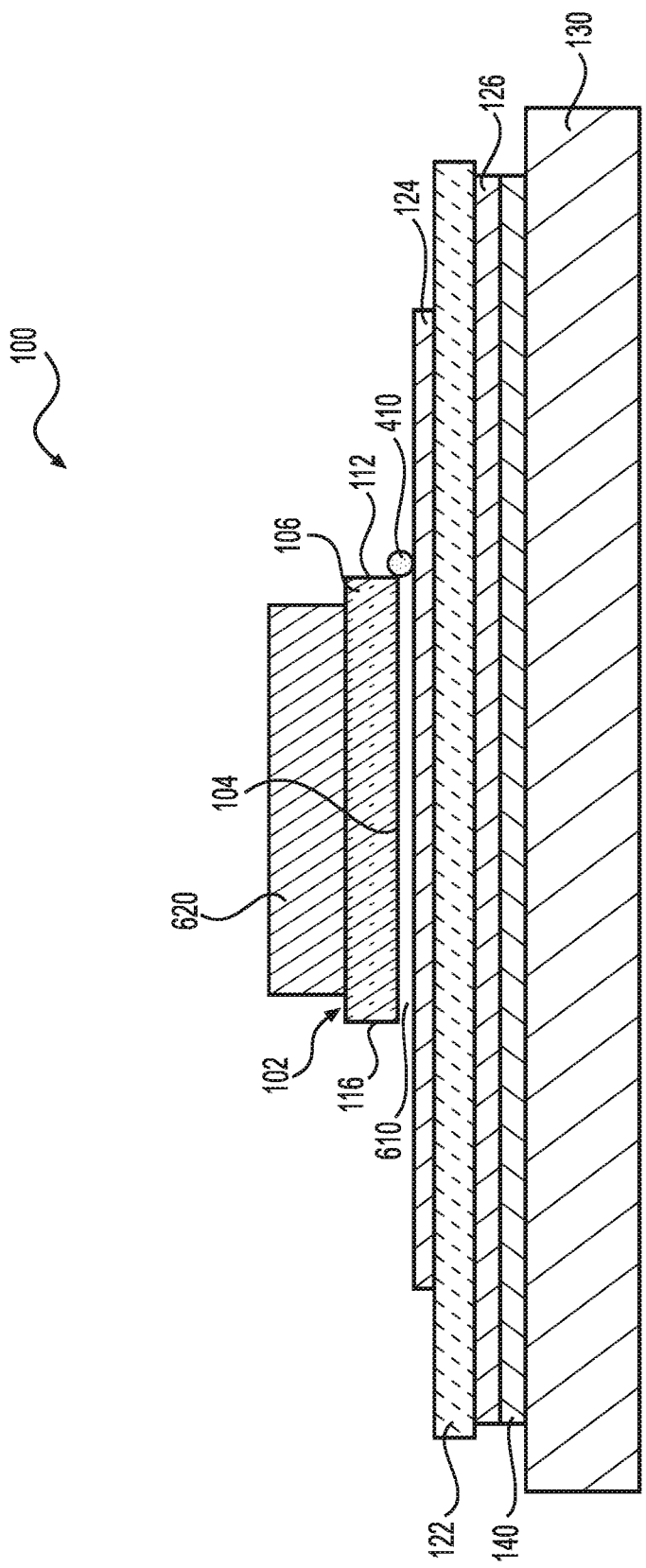
FIG. 6B is a cross-section view of a portion of the semiconductor package in FIG. 6A taken along line 6B-6B.

After the piece of solder 410 has been secured to the substrate 122, the process continues with step S315 in FIG. 3. In step S315, the die 102 is placed on top of the metallized substrate 122, specifically on top of top metallization layer 124. When the die 102 is placed on the metallized substrate 122, the bottom face 104 of the die 102 faces the top metallization layer 124 as shown in FIG. 6B. As the die 102 is resting on the top metallization layer 124, a small gap (or gaps) 610 (enlarged in the figure for clarity) exists between the bottom face 104 and the top metallization layer 124.

In step S320, the die 102 is positioned on substrate 122 with the first lateral side 112 proximate the piece of solder such that, during heating (discussed below), the piece of solder 420 will liquefy and flow into gap 610 between the bottom face 104 and the top metallization layer 124. (As used herein, reference numeral 410 is used to refer to the piece of solder and reference numeral 910 is used to refer to the solder when it is under the die 102.) The first lateral side 112 of the die 102 is preferably placed within about 0.02 inches of the piece of solder 410, and even more preferably directly adjacent to the piece of solder 410. FIG. 6A is a top view showing the die 102 placed on top of the top metallization layer 124, and the first lateral side 112 of the die 102 placed adjacent to the piece of solder 410.

As discussed above, keeping the solder wire 520 flat and in contact with the top metallization layer 124 assists in subsequent thermal processing. In some applications, it may thus be desirable to make an ultrasonic bond at an intermediate position on the solder wire 520 instead of just at the ends (first and second bonding positions 502, 504). FIG. 7 is a top view of the semiconductor package 100 after step S320 (see FIG. 3) showing an embodiment of the invention where least one intermediate ultrasonic bond 702 is made at an intermediate bonding position 802.

Figure 8A:
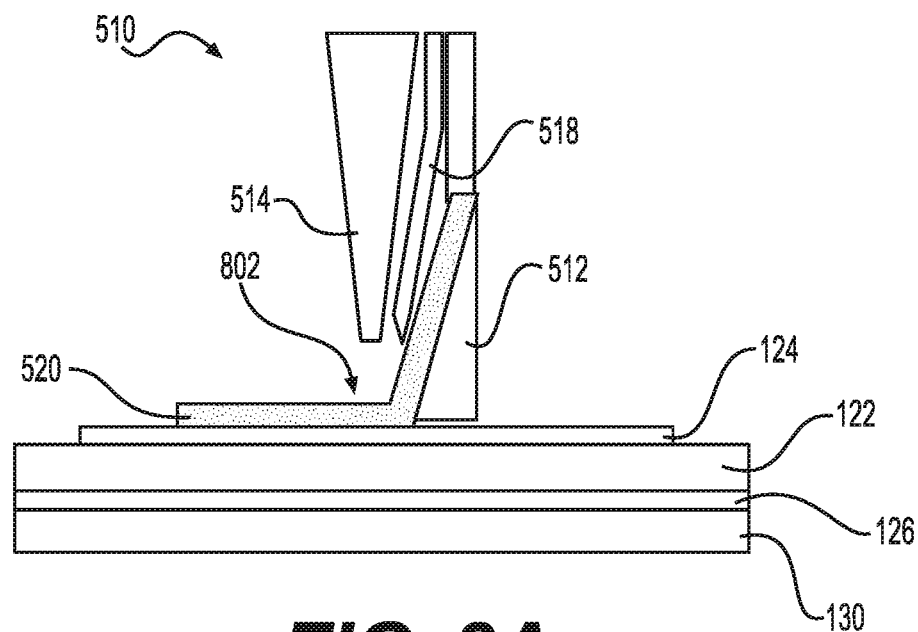
FIG. 8A is a side view of the semiconductor package after the point in time shown in FIG. 5B according to a preferred embodiment of the invention.
Figure 8B:
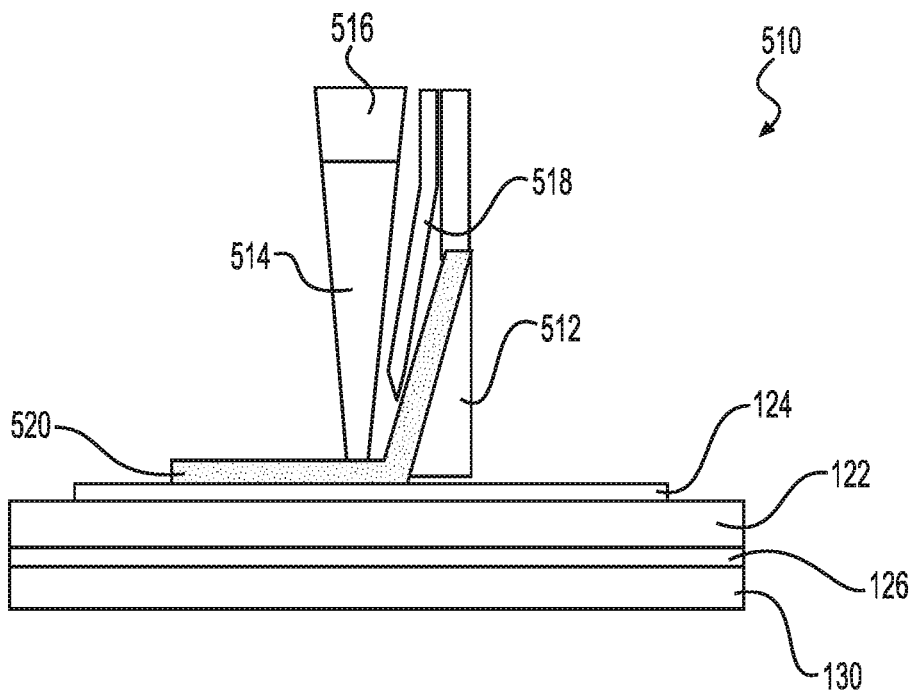
FIG. 8B is a side view of the semiconductor package at a point in time after the point in time shown in FIG. 8A.

FIGS. 8A and 8B show how the intermediate ultrasonic bond can be made during step S310. After the ultrasonic bond is made at the first bonding position 502 (discussed above with reference to FIGS. 5A and 5B), the head 510 moves as solder wire 520 is played out from the spool, to the intermediate bonding position 802, as shown in FIG. 8A. As shown in FIG. 8B, the ultrasonic bonding process is then repeated, where the bonding tool 514 is brought into contact with the solder wire 520 and ultrasonic waves are used to bond the solder wire 520 to the top metallization layer 124 at the intermediate bonding position 802 and create the intermediate ultrasonic bond 702. Once the ultrasonic bonding process is completed at the intermediate bonding position 802, the bonding tool 514 is again retracted and subsequent intermediate ultrasonic bonds are made, if necessary.

The securing step S310 then completes by making the ultrasonic bond at the other end of the solder wire 520 (second bonding position 504) and cutting the solder wire 520 as discussed above with reference to FIGS. 5C through 5E. When the piece of solder 410 is ultrasonically bonded at a plurality of locations along the piece of solder 410, the bonding spots are located preferably, at least, 0.050 inches from each other and close enough to maintain the desired shape of the piece of solder 410, which is typically an inch or less in length.

As discussed above, the die 102 may have any suitable geometry. The piece of solder 410 is suitably shaped to maintain the close proximity between the first lateral side 112 of the die 102 and the piece of solder 410, and thus the piece of solder 410 is preferably shaped to correspond to the first lateral side 112 of the die 102. Intermediate bonds 702 may be advantageously used to maintain the desired shape of the piece of solder, particularly when the piece of solder is non-linear.

Next, the semiconductor package 100 undergoes thermal processing to join the die 102 to the substrate 122. Securing the piece of solder 410 to the substrate 122 allows this subsequent thermal processing at a later point in time. Temporarily securing the piece of solder 410 to the substrate thus facilitates processing efficiencies. For example, a first piece of solder 410 may be temporarily secured to a first substrate 122 by completing steps S302 and S304. Then these steps are repeated for additional pieces of solder and substrates, such as a second piece of solder and a second substrate, thus creating an inventory of substrates with temporarily bonded pieces of solder, instead of moving directly to subsequent processing steps. A plurality of substrates with temporarily bonded pieces of solder may then be drawn from the inventory and dies are placed and positioned, in steps S315 and S320, on the substrates to create a plurality of arranged surface-mount assemblies. The plurality of arranged surface-mount assemblies may be subsequently thermally processed as a batch.

In another example, a plurality of arranged surface-mount assemblies can be prepared and then thermally processed as a batch by creating an inventory after step S320 and before thermal processing instead of or in addition to the inventory between steps S304 and S315. Here, steps S302 through S320 are performed for a first substrate, a first die, and a first piece of solder. Next, steps S302 through S320 are repeated for subsequent substrates, dies, and pieces of solder (e.g., a second substrate, a second die, and a second piece of solder) to form a plurality of arranged surface-mount assemblies. Then, the plurality of arranged surface-mount assemblies is thermally processed.

Where no inventory is created after step S304 and before S315, the order of positioning the piece of solder 410 and the die 102 may be reversed. The die 102 may be placed on the substrate 122 first and then the piece of solder 410 is placed and temporarily bonded proximate the first lateral side 112 of the die 102. The first temporary bond 402 and the second temporary bond 404 are at opposite ends of the first lateral side 112 of the die 102, a first end and a second end, for example. During the temporary bonding step of S304, the piece solder 410 does not flow into the gap 610 between the bottom face 104 of the die 102 and the top metallization layer 124 when the die 102 is placed on the substrate 122 before the piece of solder 410 is temporarily bonded.

Thermal processing of the arranged surface-mount assembly begins in step S330. Here, at least a portion of the substrate 122 and the piece of solder 410 are heated to a joining temperature. In this embodiment, the portion of the substrate 122 heated includes the top metallization layer 124 under the die 102. The joining temperature should be a temperature at which the piece of solder 410 melts and then, during step S335, flows into the gap 610. Preferably, the joining temperature is the reflow temperature of the piece of solder 410, more preferably about 30° C. higher than the reflow temperature of the piece of solder 410. Any suitable heating (or melting) apparatus known in the art may be used including, for example, a furnace or hot plate.

In step S335, the top metallization layer 124 and the piece of solder 410 are held at the joining temperature or a temperature greater than the joining temperature. During step S335, the piece of solder 410 melts and flows (as solder 910) into the gap 610. The solder 910 is drawn into the gap 610 by capillary action.

Figure 9A:
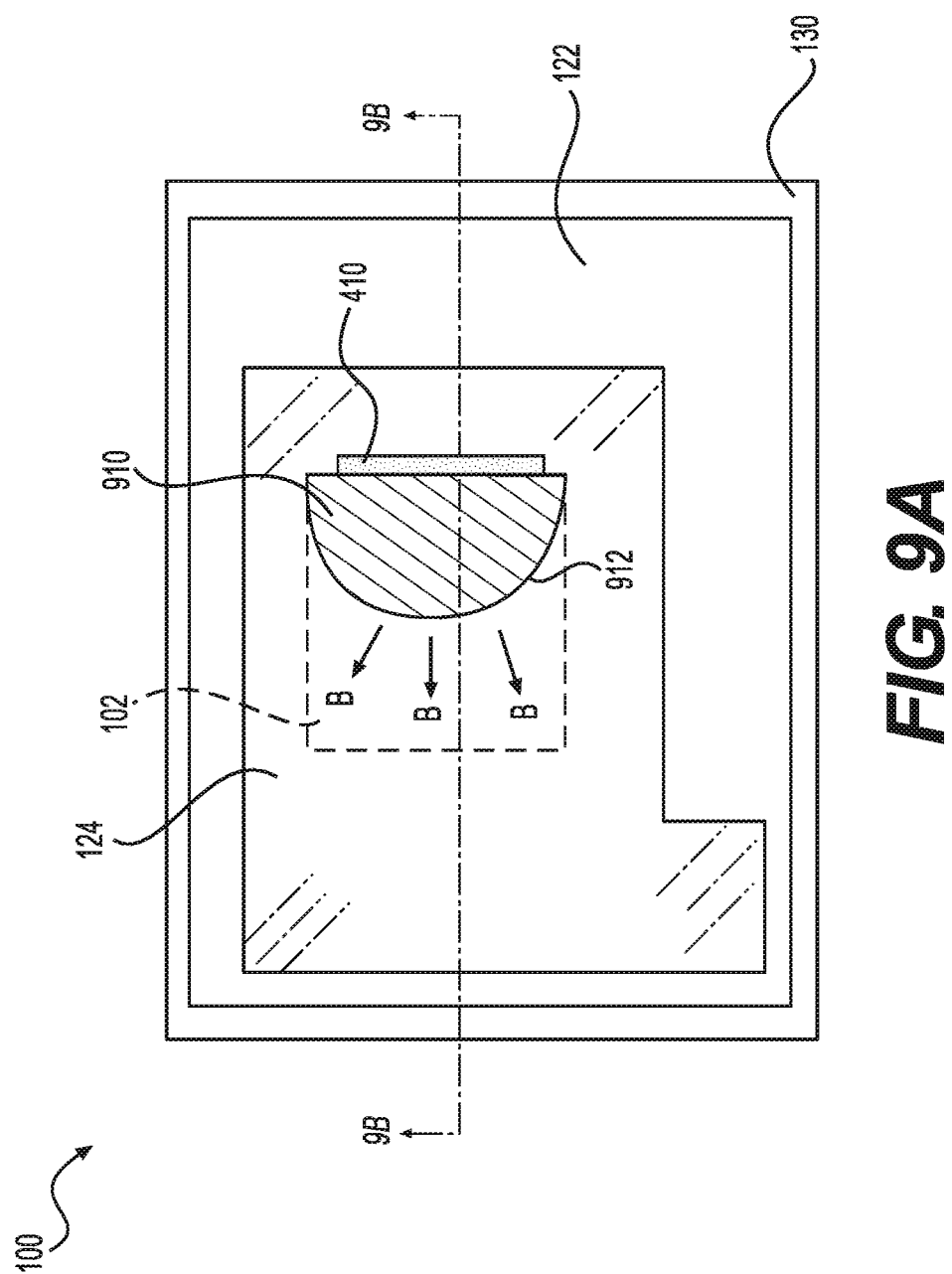
FIG. 9A is a top view of the semiconductor package at step S335.
Figure 9B:
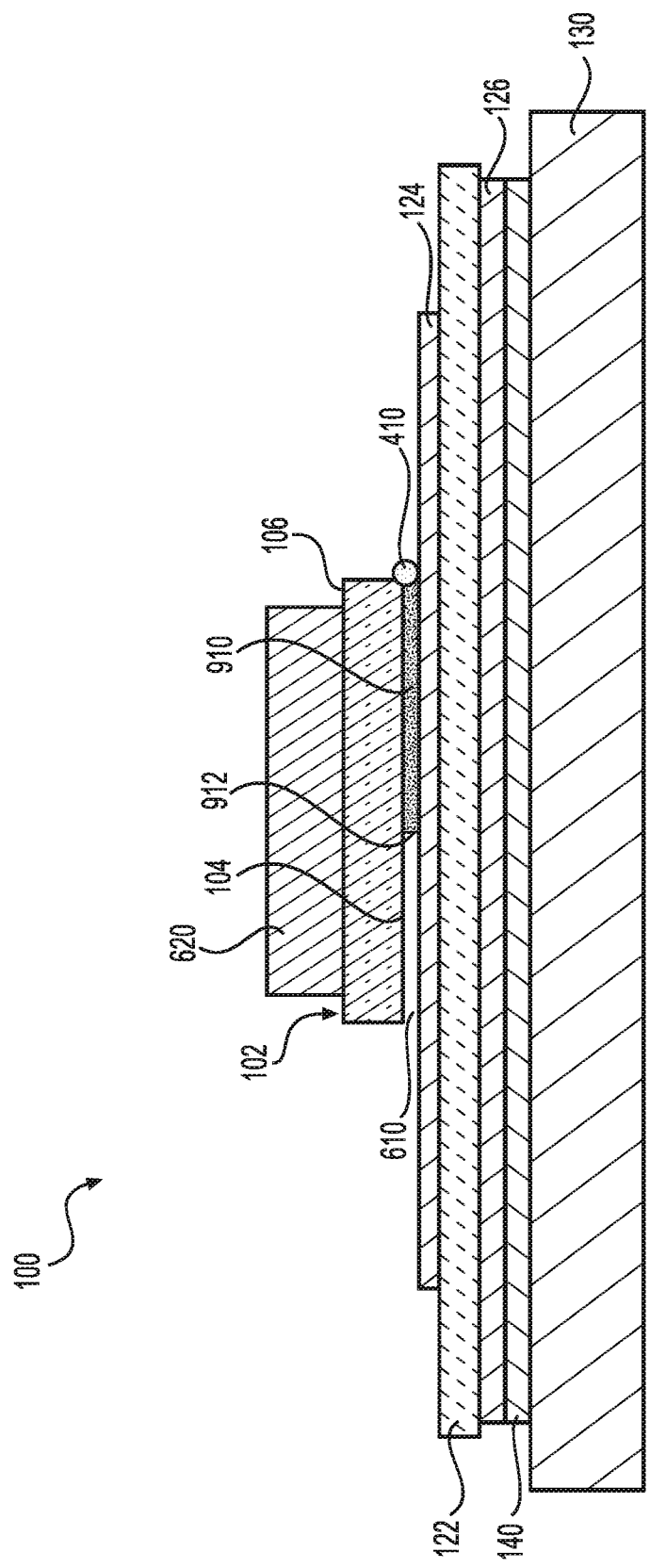
FIG. 9B is a cross-section view of a portion of the semiconductor package in FIG. 9A taken along line 9B-9B.

FIGS. 9A and 9B show the semiconductor package 100 at a first point in time during the hold of step S335. FIG. 9A (and 9C below) shows the die 102 in hidden lines in order to illustrate the solder 910. Here, a front edge 912 of the melted solder 910 has advanced part way into the gap 610 under die 102. As the front edge 912 advances in a wicking action, any gas in the gap 910 under the die 102 is expelled in the directions shown by the arrows B, thus resulting in an attachment layer 150 with relatively few or even no voids.

The inventors have found that it is desirable for the solder 910 to flow evenly under the die 102. Therefore, the piece of solder 910 has a length L (see FIG. 4 or FIG. 6A) that is preferably from about 100 percent of the length of the first lateral side 112 to about 20 percent of the length of the first lateral side 112.

Figure 9C:
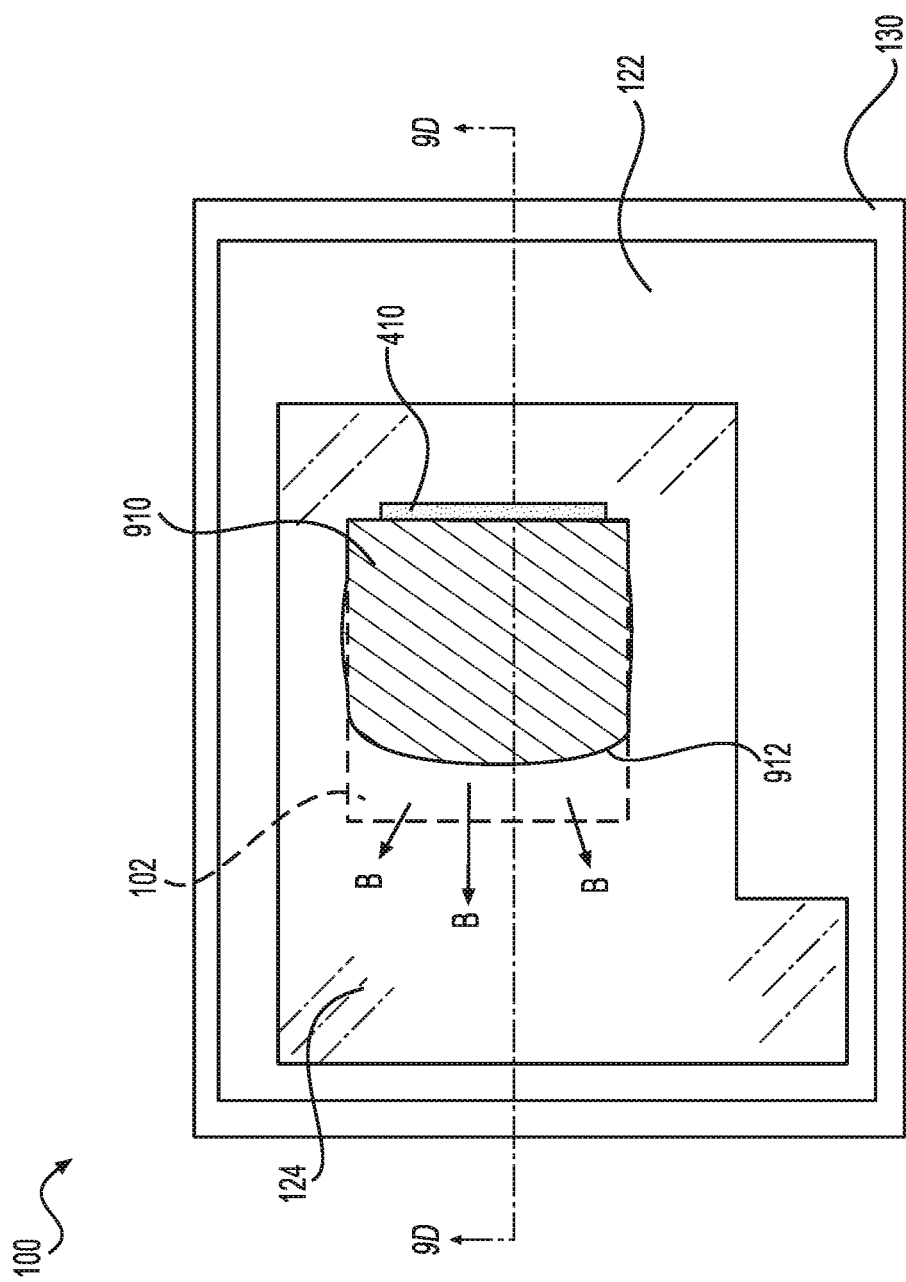
FIG. 9C is a top view of the semiconductor package at another point in time in step S335.
Figure 9D:
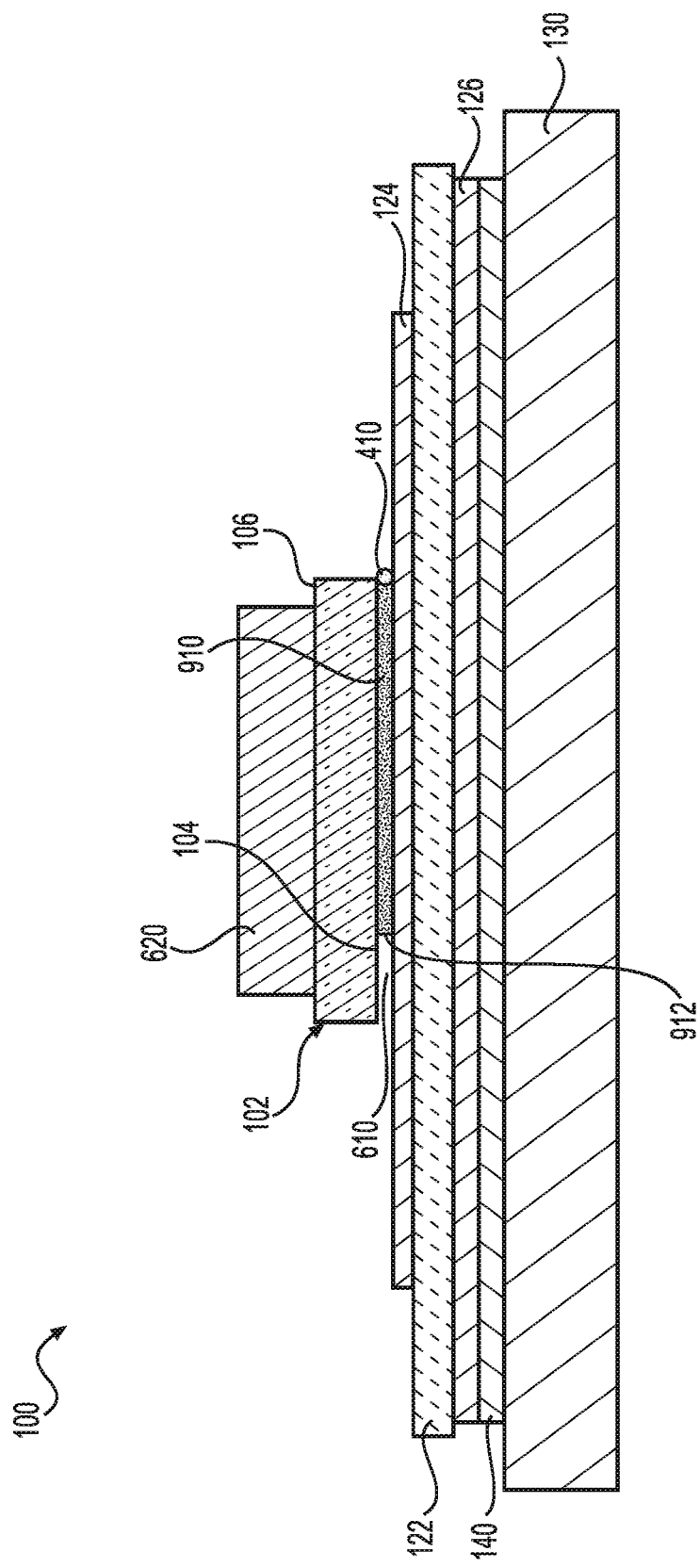
FIG. 9D is a cross-section view of a portion of the semiconductor package in FIG. 9C taken along line 9D-9D.

FIGS. 9C and 9D show the semiconductor package 100 at a second point in time during the hold of step S335. This second point in time is later than the first point in time, and the front edge 912 has advanced further under the die 102. During the hold in step S335, the piece of solder 410 collapses as the solder 910 spreads under the die 102. The solder 410/910 and the top metallization layer 124 are held at the joining temperature or a temperature greater than the joining temperature sufficient for the solder 910 to fill and cover the area under the die 102.

A suitable temporary bond will preferably reflow at the joining temperature or greater leaving very little, if any, solder 410 at the bonding positions. An ultrasonic bond is thus a suitable temporary bond because, during the hold of step S335, the ultrasonic bonds used to secure the piece of solder 410 to the top metallization layer 124 change phase, allowing the solder 410 at the first and second temporary bonds 402, 404 to reflow.

After the solder 910 has covered the area under the die 102, the solder 910 and the top metallization layer 124 are cooled in step S340. Here, the solder 910 solidifies and forms attachment layer 150 to join the die 102 with the substrate 122.

Heating the piece of solder 410 to a joining temperature or greater in an atmosphere that is not controlled may result in various oxides forming in the solder 910. These oxides may prevent the die 102 from joining the top metallization layer 124 at the locations where these oxides have formed. To address this, a cover gas can be applied in step S345, and the heating step S330, the holding step S335, and the cooling step S340 may be performed in the presence of the cover gas. Any suitable cover gas known in the art may be used including gasses comprising hydrogen, nitrogen, and/or formic acid.

Any suitable method known in the art may be used to apply the cover gas (step S345), heat the top metallization layer 124 and the piece of solder 410 (step S330), hold the top metallization layer 124 and the piece of solder 410 at the joining temperature or greater (step S335), and cool the top metallization layer 124 and the solder 910 (step S340). Suitable devices for performing these steps are belt furnaces, such as those manufactured by BTU, North Billerica, Mass. 01862, USA.

Other suitable methods may be used to prevent oxide formation during the soldering process, including for example the use of flux. Any suitable flux known in the art may be used. When the piece of solder 410 is manufactured by cutting solder wire to length, for example, the piece of solder 410 may be cut from flux cored solder wire. The flux will be driven out of the solder joint (gap 610) due to capillary movement of the solder.

The inventors have found that it is preferable to apply pressure to the top of the die 102 in step S325. In this embodiment, the pressure is applied by placing a weight 620 on top of the die 102 (see FIGS. 6A, 6B, 7, 9B and 9D). The application of pressure controls the thickness uniformity of the attachment layer 150 and enhances the effectiveness of the capillary action. The application of pressure is especially suited for smaller, lighter weight dies in order to achieve a desirable gap 610 thickness (and resultant attachment layer thickness 150) suitable for capillary action. Preferably, the attachment layer 150 has a thickness from about 0.1 mil to about 3 mils. Preferably, the pressure is evenly distributed over the top surface of the die 102. Preferably, the weight 620 applies a pressure from about 0.0002 psi to about 0.03 psi. The weight 620 preferably comprises materials that do not damage the die 102, particularly under the temperatures used in this process. The weight may suitably comprise, for example, molybdenum, brass, stainless steel, or graphite. When pressure is applied (a weight 620 in this embodiment), it is removed in step S350.

Figure 10:
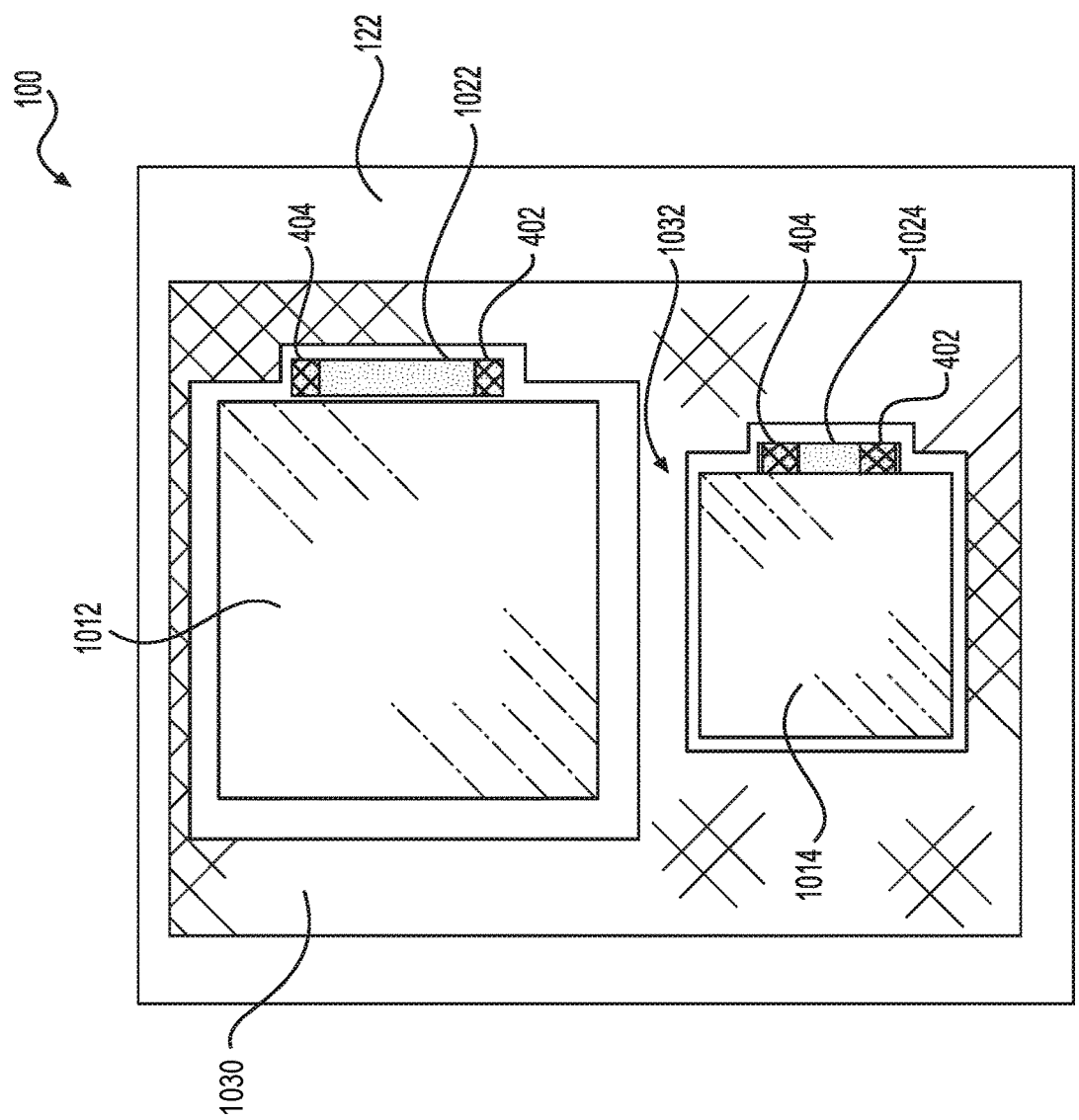
FIG. 10 shows a top view of a semiconductor package with multiple dies.

Each semiconductor package 100 may include more than one die 102. As shown in FIG. 10, for example, the semiconductor package includes two dies, a first die 1012 and a second die 1014. In assembling this semiconductor package, a first piece of solder 1022 is placed on top of the substrate 122 and temporarily bonded to the top metallization layer 124 as discussed above in steps S302 and S304. A second piece of solder 1024 is likewise placed on top of the substrate 122 and temporarily bonded to the top metallization layer 124. In this configuration, each piece of solder 1022, 1024 is temporally bonded to the substrate using a first and second temporary bond 402, 404. The first and second dies 1012, 1014 are also placed and positioned on the substrate, as discussed above in steps S315 and S320, to be proximate first and second pieces of solder 1022, 1024, respectively.

Also as shown in FIG. 10, a solder stop 1030 may also be used to prevent the solder 910 from running out past the die 102 to other portions of the top metallization layer. In this embodiment, solder stop 1030 is applied around to prevent solder from running out during the thermal processing. As shown in FIG. 10, for example, the solder stop 1030 is designed to surround the dies 1012, 1014 and cover an area 1032 between the first die 1012 and the second die 1014. In this way, it prevents the solder 910 from forming an unintended solder bridge between the first die 1012 and the second die 1014.

The solder stop 1030 may be applied at any suitable time prior to thermal processing in Step S330. Where the solder stop 1030 is applied before placement of the first and second pieces of solder 1022, 124, the solder stop 1030 is preferably not applied on the area of the top metallization layer 124 where the pieces of solder 1022, 1024 are placed.

Any suitable solder stop 1030 may be used including, for example, a solder mask and altering the surface of the top metallization layer. In many cases these solder stops 1310 are applied as part of the process to manufacture the substrate 122 and, in particular, to the metallization layer 124.

IV. Second Embodiment

Figure 11:
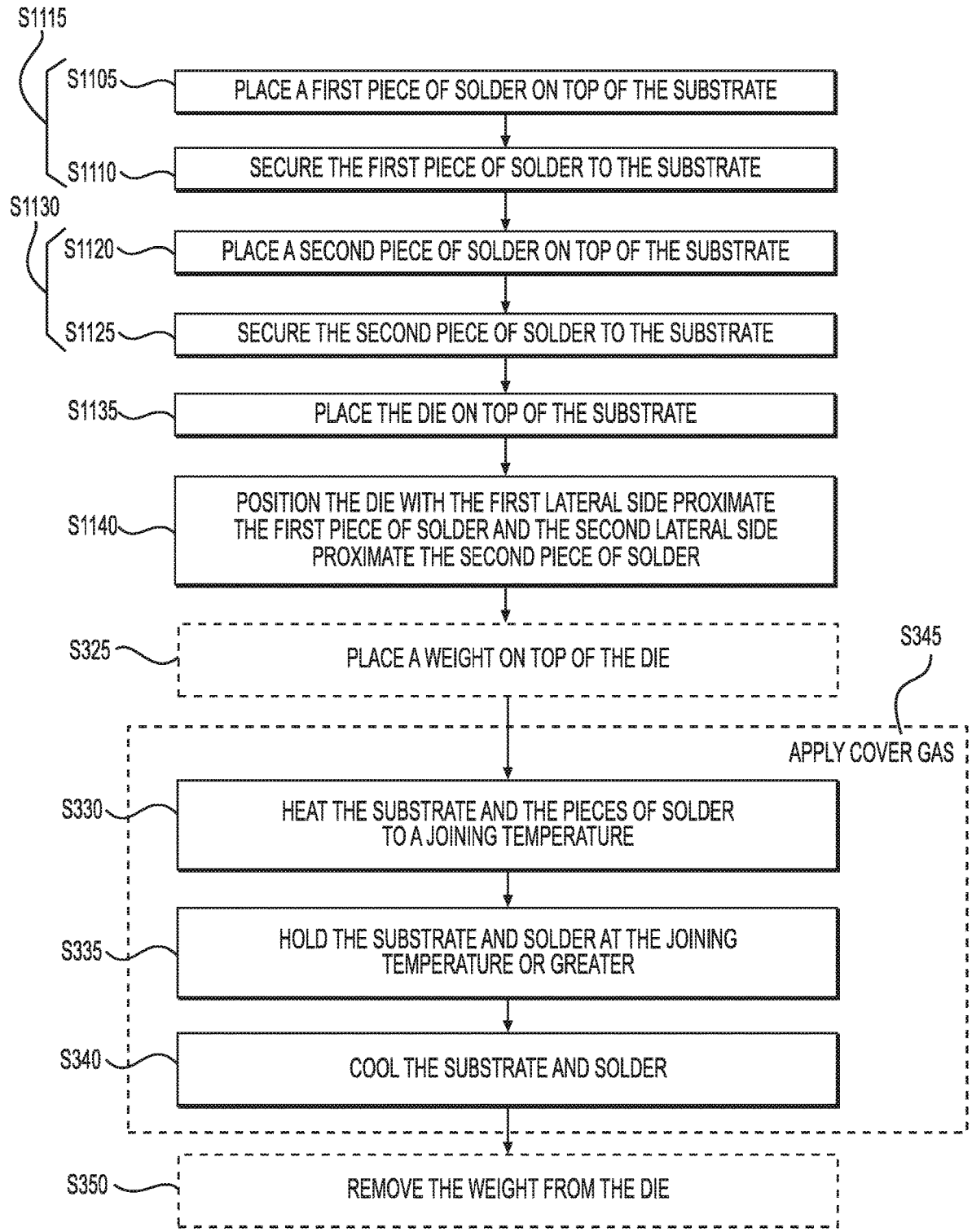
FIG. 11 is a flowchart of a method of joining a die to a substrate according to a second preferred embodiment of the invention.
Figure 12:
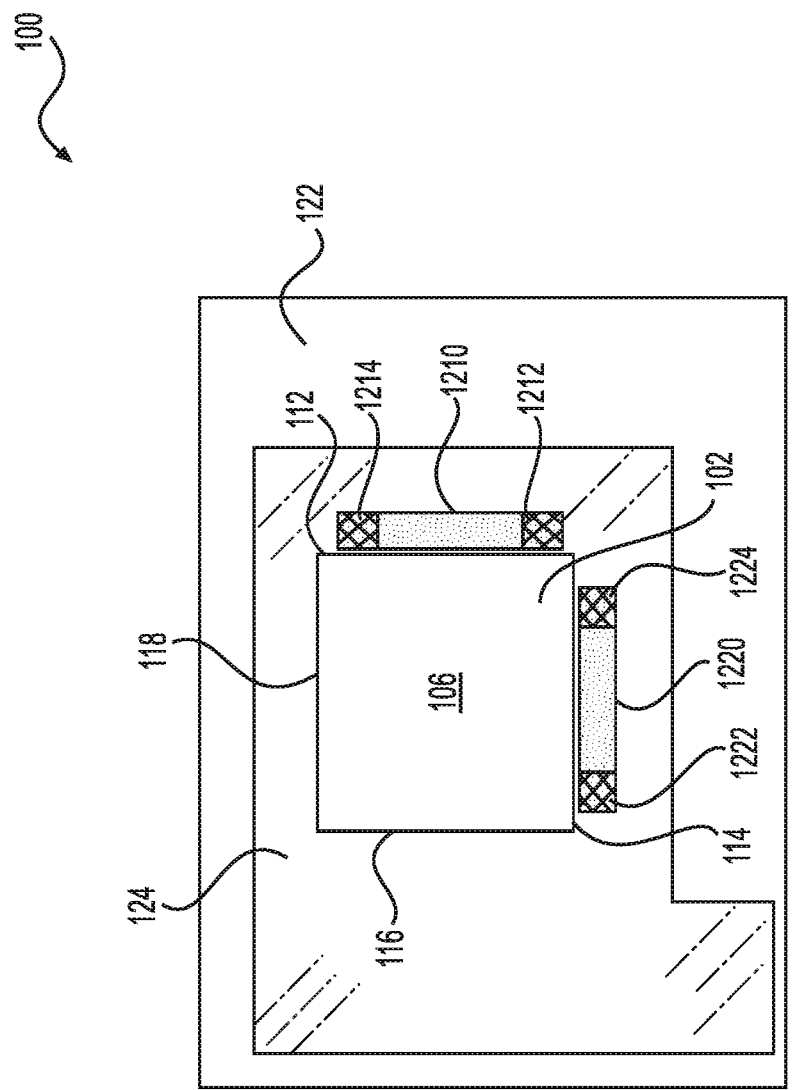
FIG. 12 is a top view of the semiconductor package after step S1140.

The method of joining die 102 to the substrate 122 according to a second preferred embodiment will now be described with reference to the flow chart shown in FIG. 11 and FIG. 12. Many steps in this embodiment are similar to those in the first embodiment. The descriptions of these steps discussed above apply to this embodiment and are generally not repeated in the discussion here.

In some instances, it may be preferable to use more than one piece of solder 410 for each die 102. When the die 102 has, for example, a relatively large rectangular geometry, it is preferable to use two pieces of solder: a first piece of solder 1210 and a second piece of solder 1220. In step S1105, the first piece of solder 1210 is placed on top of the substrate 122. The first piece of solder 1210 is then secured to the substrate in step S1110. Steps S1105 and S1110 may be performed by using the approach of steps S310 and S315 discussed in the first embodiment above, and like that embodiment, steps S1105 and S1110 may be combined as step S1115. The first piece of solder 1210 may be temporarily bonded to the top metallization layer 124 by a first temporary bond 1212 and a second temporary bond 1214.

In step S1110, the second piece of solder 1220 is placed on the substrate 122 and oriented relative to the first piece of solder 1210 so that when the die 102 is placed (discussed further below) both the first and second pieces of solder 1210, 1220 are each proximate a different one of the lateral sides of the die 102. The second piece of solder 1220 is secured to the substrate in step S1125. As with the first piece of solder 1210, steps S1110 and S1125 may be combined as step S1130, where the second piece of solder 1220 is bonded to the top metallization layer 124 with a plurality of temporary bonds 1222, 1224.

The die 102 is then placed on the substrate 122 in step S1135 and positioned, in step S1140, such that the first lateral side 112 of the die 102 is proximate the first piece of solder 1210 and the second lateral side 114 of the die 102 is proximate the second piece of solder 1220. In this embodiment, the first and second lateral sides 112, 114 are adjacent, such that as the solder front edge advances from the corner of die 102 where the first and second lateral sides 112, 114 intersect towards the corner where the third and fourth lateral sides 116, 118 intersect. FIG. 15 shows the semiconductor package 100 after step S1140. Although this embodiment has been described by placing the die 102 on the substrate 122 after the first and second pieces of solder 1210, 1220, the die 102 may be placed first as described above.

Figure 13:
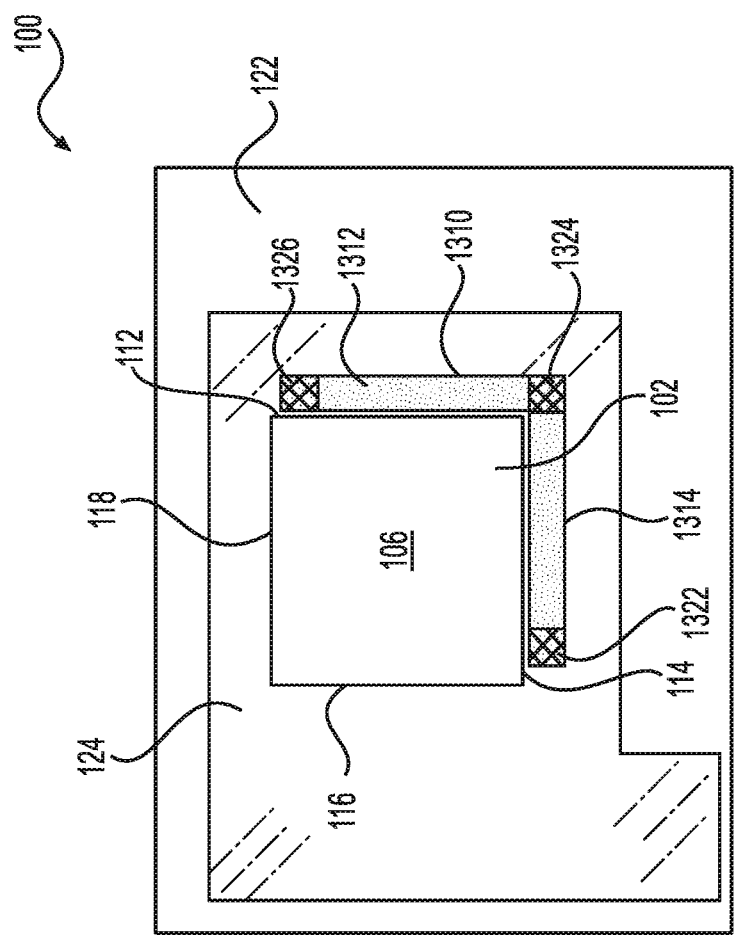
FIG. 13 is a top view of the semiconductor package after step S320 with an alternate piece of solder.

A single piece of solder 1310 may be used as shown in FIG. 13, instead of using two pieces of solder 1210, 1220 that are proximate two lateral sides of the die 102. Referring to the flow chart in FIG. 3 for the processing steps, the piece of solder 1310 may be placed and temporarily secured to the substrate 112, in step S310, with three temporary bonds 1322, 1324, 1326. When the die 102 is rectangular, the piece of solder 1310 may have an L-shape as shown in FIG. 13. The die 102 is placed on the substrate 122 in step S315 and positioned, in step S320, with the first lateral side 112 proximate a first leg portion 1312 of the piece of solder 1310 and the second lateral side 114 of the die 102 proximate a second leg portion 1314 of the piece of solder 1310.

Specific materials including metals have been discussed herein; composites and alloys of these materials are also contemplated to be within the scope of the invention. Material properties have also been discussed herein; these material properties are at room temperature unless otherwise noted.

The embodiments discussed herein are examples of preferred embodiments of the present invention and are provided for illustrative purposes only. They are not intended to limit the scope of the invention. Although specific configurations, structures, materials, etc. have been shown and described, such are not limiting. Modifications and variations are contemplated within the scope of the invention, which is to be limited only by the scope of the issued claims.

What is claimed is:

1. A method of joining a surface-mount component to a substrate, the method comprising the steps of:
    placing a piece of solder on top of a substrate;
    temporarily bonding the piece of solder to the substrate with a temporary bond;
    placing a surface-mount component on top of the substrate after temporarily bonding the piece of solder to the substrate, a bottom side of the surface-mount component facing the substrate, an area of the substrate underneath the bottom side of the surface-mount component being an attachment area, the surface-mount component further having a lateral side;
    positioning the surface-mount component with the lateral side proximate the piece of solder, with the piece of solder positioned outside the attachment area;
    heating the substrate and the piece of solder to a joining temperature for a time sufficient for the solder to flow into a gap between the bottom side of the surface-mount component and the substrate over at least a portion of the attachment area; and
    cooling the substrate and solder.

2. The method of claim 1, wherein the temporary bond is an ultrasonic bond.

3. The method of claim 2, further comprising, prior to the bonding step, applying a force to the piece of solder with a bonding tool,
    wherein the bonding tool is used to make the ultrasonic bond.

4. The method of claim 3, wherein the applied force is from 1 N to 12 N.

5. The method of claim 2, wherein the bonding step includes applying ultrasonic waves having a frequency from 40 kHz. to 90 kHz to create the ultrasonic bond.

6. The method of claim 2, wherein the bonding step includes applying ultrasonic waves for a duration from 50 milliseconds to 300 milliseconds to create the ultrasonic bond.

7. The method of claim 1, wherein the lateral side of the surface-mount component is placed within about 0.02 inches of the piece of solder.

8. The method of claim 1, wherein the substrate is a metallized substrate having a top metallization layer and the temporary bond is formed between the piece of solder and the top metallization layer.

9. The method of claim 1, wherein the joining temperature is substantially a reflow temperature of the solder.

10. The method of claim 1, further comprising the steps of:
    applying a pressure to a top surface of the surface-mount component; and
    removing, after cooling the substrate and solder, the pressure from the surface-mount component.

11. The method of claim 1, further comprising performing the heating step and the cooling step in the presence of a cover gas.

12. The method of claim 1, wherein the lateral side is a first lateral side and the piece of solder is a first piece of solder proximate the first lateral side of the surface-mount component, the surface-mount component further has a second lateral side, and the method of claim 1 further comprises:
    placing a second piece of solder on top of the substrate; and
    temporarily bonding the second piece of solder to the substrate with a temporary bond,
    wherein positioning the surface-mount component further includes positioning the surface-mount component with the second lateral side proximate the second piece of solder and the second piece of solder outside the attachment area after temporarily bonding the second piece of solder to the substrate.

13. The method of claim 12, wherein the first lateral side of the surface-mount component and the second lateral side of the surface-mount component are adjacent.

14. The method of claim 1, wherein the lateral side is a first lateral side and the surface-mount component further has a second lateral side, and the piece of solder is placed proximate the first and second lateral sides of the surface-mount component.

15. A method of forming a plurality of surface-mount devices, the method comprising the steps of:
    placing a first piece of solder on top of a first substrate;
    temporarily bonding the first piece of solder to the first substrate with a temporary bond;
    placing a second piece of solder on top of a second substrate;
    temporarily bonding the second piece of solder to the second substrate with a temporary bond;
    assembling a first arranged surface-mount assembly, the steps comprising:
        placing a first surface-mount component on top of the first substrate after temporarily bonding the first piece of solder to the first substrate, a bottom side of the first surface-mount component facing the first substrate, an area of the first substrate underneath the bottom side of the first surface-mount component being a first attachment area, the first surface-mount component further having a lateral side; and positioning the first surface-mount component with the lateral side of the first surface-mount component proximate the first piece of solder, with the first piece of solder positioned outside the first attachment area;

assembling a second arranged surface-mount assembly, the steps comprising:

placing a second surface-mount component on top of the second substrate after temporarily bonding the second piece of solder to the second substrate, a bottom side of the second surface-mount component facing the second substrate, an area of the second substrate underneath the bottom side of the second surface-mount component being a second attachment area, the second surface-mount component further having a lateral side; and positioning the second surface-mount component with the lateral side of the second surface-mount component proximate the second piece of solder, with the second piece of solder positioned outside the second attachment area;

heating the first and second arranged surface-mount assemblies to a joining temperature;

holding the first and second arranged surface-mount assemblies at a temperature greater than or equal to the joining temperature for a time sufficient for the solder to flow into gaps between the bottom side of the first and second surface-mount components and the first and second substrates over at least a portion of the first and second attachment areas; and cooling the first and second arranged surface-mount assemblies to form a plurality of surface-mount devices.

16. The method of claim 15, wherein each of the temporary bond used to bond the first piece of solder to the first substrate and the temporary bond used to bond the second piece of solder to the second substrate is an ultrasonic bond.

17. The method of claim 15, further comprising the steps of:

placing a third piece of solder on top of the first substrate;
temporarily bonding the third piece of solder to the first substrate with a temporary bond;

placing a fourth piece of solder on top of the second substrate; and temporarily bonding the fourth piece of solder to the second substrate with a temporary bond, wherein assembling the first arranged surface-mount assembly further comprises:

placing a third surface-mount component on top of the first substrate after temporarily bonding the third piece of solder to the first substrate, a bottom side of the third surface-mount component facing the first substrate, an area of the first substrate underneath the bottom side of the third surface-mount component being a third attachment area, the third surface-mount component further having a lateral side; and positioning the third surface-mount component with the lateral side of the third surface-mount component proximate the third piece of solder, with the third piece of solder positioned outside the third attachment area, and wherein assembling the second arranged surface-mount assembly further comprises:

placing a fourth surface-mount component on top of the second substrate after temporarily bonding the fourth piece of solder to the second substrate, a bottom side of the fourth surface-mount component facing the second substrate, an area of the second substrate underneath the bottom side of the fourth surface-mount component being a fourth attachment area, the fourth surface-mount component further having a lateral side; and positioning the fourth surface-mount component with the lateral side of the fourth surface-mount component proximate the fourth piece of solder, with the fourth piece of solder positioned outside the fourth attachment area, and wherein the holding step further includes holding the first and second arranged surface-mount assemblies at a temperature greater than or equal to the joining temperature for a time sufficient for the solder to flow into gaps between the bottom side of the third and fourth surface-mount components and the first and second substrates over at least a portion of the third and fourth attachment areas.

* * * * *